United States Patent
Shi et al.

(10) Patent No.: US 10,692,280 B2
(45) Date of Patent: Jun. 23, 2020

(54) 3D INDOOR MODELING METHOD, SYSTEM AND DEVICE BASED ON POINT CLOUD DATA

(71) Applicant: THE HONG KONG POLYTECHNIC UNIVERSITY, Hong Kong (CN)

(72) Inventors: Wenzhong Shi, Hong Kong (CN); Wael Ahmed, Hong Kong (CN)

(73) Assignee: THE HONG KONG POLYTECHNIC UNIVERSITY, Hong Kong (CN)

( * ) Notice: Subject to any disclaimer, the term of this patent is extended or adjusted under 35 U.S.C. 154(b) by 0 days.

(21) Appl. No.: 16/226,751

(22) Filed: Dec. 20, 2018

(65) Prior Publication Data

US 2020/0111251 A1    Apr. 9, 2020

(30) Foreign Application Priority Data

Oct. 8, 2018    (CN) .......................... 2018 1 1167619

(51) Int. Cl.
*G06T 17/05*    (2011.01)
*G06T 7/11*    (2017.01)
(Continued)

(52) U.S. Cl.
CPC .............. *G06T 17/05* (2013.01); *G06F 30/13* (2020.01); *G06T 7/11* (2017.01); *G06T 7/521* (2017.01); *G06T 2207/10028* (2013.01)

(58) Field of Classification Search
None
See application file for complete search history.

(56) References Cited

U.S. PATENT DOCUMENTS

2017/0076456 A1* 3/2017 Goodman ............... G06T 15/60
2018/0330184 A1* 11/2018 Mehr ..................... G06F 17/18
(Continued)

OTHER PUBLICATIONS

Nurunnabi, Abdul, Geoff West, and David Belton. "Outlier detection and robust normal-curvature estimation in mobile laser scanning 3D point cloud data." Pattern Recognition 48.4 (2015): 1404-1419.*

(Continued)

*Primary Examiner* — Ryan M Gray
(74) *Attorney, Agent, or Firm* — Spurson & Ferguson (Hong Kong) Limited

(57) ABSTRACT

The present application discloses a 3D indoor modeling method based on point cloud data. After pre-processing the raw point cloud data, the normal vectors and curvature values of the point cloud data are obtained through local surface properties analysis. By 3D point segmentation, the initial planes can be obtained. After performing the room layout re-construction, an initial 3D model can be generated. Finally, in combination with the returned laser pulse and the distance between the wall surface-objects and the wall surface, the specific form of the wall surface-object is reconstructed to achieve high-precision 3D modeling of complex indoor scenes. The method does not need any prior knowledge in advance, and strengthens the recognition and re-construction of the specific form of the wall surface, particularly suitable for high-precision 3D modeling of indoor scenes with high complexity.

30 Claims, 23 Drawing Sheets

(51) Int. Cl.
  *G06T 7/521* (2017.01)
  *G06F 30/13* (2020.01)

(56) References Cited

U.S. PATENT DOCUMENTS

2019/0035165 A1* 1/2019 Gausebeck .......... H04N 13/246
2019/0108639 A1* 4/2019 Tchapmi ................ G06T 7/10
2019/0155302 A1* 5/2019 Lukierski ............... G06T 17/00

OTHER PUBLICATIONS

Michailidis et al.; Bayesian graph-cut optimization for wall surfaces reconstruction in indoor environments; The Visual Computer, Oct. 2017; pp. 1347-1355; vol. 33, Issue 10; Springer.
Murali et al.; Indoor Scan2BIM Building Information Models of House Interiors; International Conference on Intelligent Robots and Systems; Sep. 2017; pp. 6126-6133; IEEE.
Wang et al.; Modeling Indoor Spaces Using Decomposition and Reconstruction of Structural Elements; Photogrammetric Engineering & Remote Sensing; Dec. 2017; pp. 827-841; vol. 83, No. 12; American Society for Photogrammetry and Remote Sensing.

* cited by examiner

3D INDOOR MODELING METHOD, SYSTEM AND DEVICE BASED ON POINT CLOUD DATA

CROSS-REFERENCE TO RELATED APPLICATIONS

This application claims priority to Chinese Invention Patent Application No. 201811167619.6, filed on Oct. 8, 2018, the entirety of which is incorporated herein by reference.

FIELD OF THE INVENTION

The present disclosure generally relates to the field of information mapping technology. In particular, the present disclosure relates to a three-dimensional (3D) indoor modeling method, system, device and computer readable storage medium based on point cloud data.

BACKGROUND 3D indoor modeling is of great significance for various application fields, and thus various 3D laser scanning devices have been derived. These devices continuously project laser pulses to obtain the point cloud data of the target indoor environment and try to rely on these point cloud data to build a 3D model of the target indoor environment.

The 3D modeling speed in an ideal indoor environment (low complexity) can basically meet the demand, but the actual indoor environment usually has a higher complexity. All kinds of furniture items may block each other and may be placed in disorder, and there may be some special, complex constructions, thereby increasing the difficulty of building 3D models based on raw point cloud data (raw dataset). For example, there may be some difficulties in determining structural elements (walls, ceiling and floor) or wall surface-objects (windows, doors and other openings) in indoor scenes. These difficulties include disorder and blocking problems caused by furniture that may block some walls or windows, as well as messy conditions in offices or apartments. Some rooms are laid out according to the regular shape of the orthogonal boundaries, but some rooms are not laid out like this, causing the complexity of the room layout.

The complexity of the indoor environment needs to be solved with different methods according to different situations. For example, the Manhattan hypothesis only involves the detection of orthogonal structures, and the other methods are to obtain the prior knowledge of the objects in the target indoor environment in advance and use the prior knowledge to provide guidance for the actual building of a 3D model. The prior knowledge is analogous to having a teacher who knows the answer and guides the student to answer the question. However, this is rarely the situation in which prior knowledge is normally unavailable. Accordingly, there is a need in the art to develop a 3D indoor modeling method for complex indoor scenes efficiently by using the raw point cloud data only without any prior knowledge.

SUMMARY OF THE INVENTION

It is an object of the present disclosure to provide a 3D indoor modeling method based on point cloud data.

In accordance with various embodiments of the present disclosure, a method for building a 3D indoor model based on raw point cloud data by a processor without any prior knowledge of an indoor scene is disclosed. The raw point cloud data being acquired by a laser scanner with respect to the indoor scene. The method comprises: (1) removing noise and outliers from the raw point cloud data to obtain processed point cloud data; (2) performing local surface properties analysis on the processed point cloud data to obtain normal vectors and curvature values; (3) performing 3D point segmentation on the processed point cloud data based on the normal vectors and curvature values to obtain a plurality of initial planes having a plurality of points in a 3D space; (4) constructing an initial 3D model of rooms based on the plurality of initial planes; and (5) performing wall surface-object re-construction to optimize the initial 3D model with additional details related to wall surface-objects.

In accordance with a further aspect of the present disclosure, the step of the removing noise and outliers from the raw point cloud data further comprises: (1) performing down-sampling on the raw point cloud data to obtain down-sampled point cloud data; and (2) removing outliers from the down-sampled point cloud data to obtain the processed point cloud data.

In accordance with a further aspect of the present disclosure, the step of the 3D point segmentation on the processed point cloud data further comprises: (1) segmenting the processed point cloud data into a plurality of clusters using a region growing algorithm based on the normal vector and the curvature value; and (2) processing each of the plurality of clusters using a Random Sample Consensus (RANSAC) algorithm to obtain the plurality of initial planes.

In accordance with a further aspect of the present disclosure, the step of the constructing of the initial 3D model of the rooms based on the plurality of initial planes further comprises: (1) performing re-orientation and structural element detection operation for the whole scene for better recognition of ceiling, walls and floor; (2) applying room clustering for detection of separate rooms from the whole scene using the benefits of structural elements detection from the previous step; and (3) performing room layout re-construction to construct the initial 3D model.

In accordance with a further aspect of the present disclosure, the step of the performing of wall surface-object re-construction to optimize the initial 3D model further comprises: (1) projecting and rasterizing the point cloud data within a threshold distance of less than a wall thickness; (2) clustering and recognizing the detected empty space.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF THE DRAWINGS

The appended drawings, where like reference numerals refer to identical or functionally similar elements, contain figures of certain embodiments to further illustrate and clarify various aspects, advantages and features of the 3D indoor modeling method, system and device as disclosed herein. It will be appreciated that these drawings and graphs depict only certain embodiments of the invention and are not intended to limit its scope. The 3D indoor modeling method, system and device as disclosed herein will be described and explained with additional specificity and detail through the use of the accompanying drawings in which.

DETAILED DESCRIPTION

Figure 1:
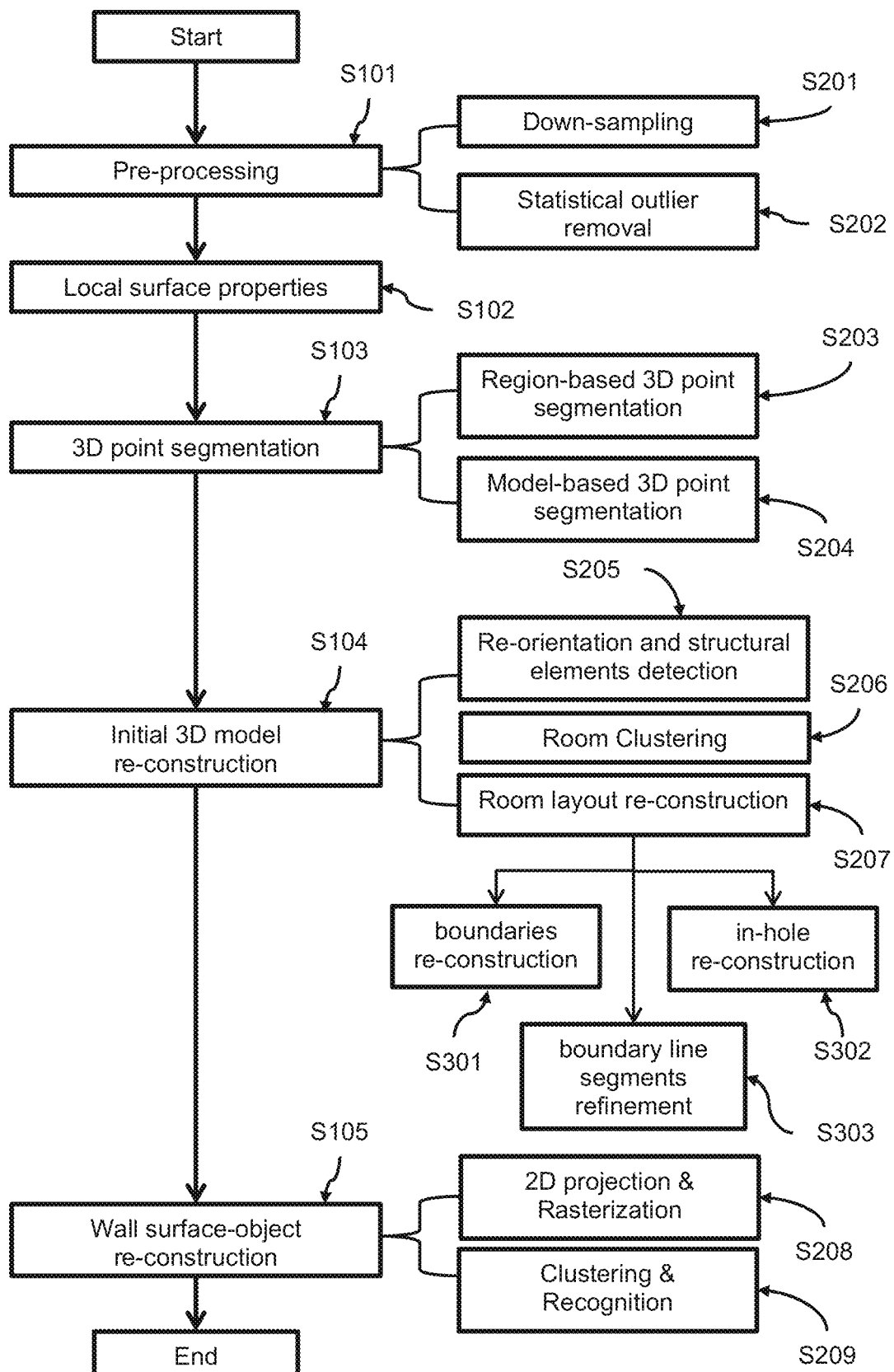
FIG. 1 is a flowchart showing a 3D indoor modeling method based on point cloud data in accordance with certain embodiments of the present disclosure.

The present disclosure generally relates to a 3D indoor modeling method, system device and computer readable storage medium based on point cloud data. In particular, the present disclosure can automatically reconstruct 3D indoor models with semantic information from the unstructured 3D point cloud data.

After the pre-processing of the raw point cloud data, the normal vectors and curvature values of the point cloud data are obtained through local surface properties analysis, and according to the normal vector and curvature value, 3D point segmentation is conducted for the point cloud data to obtain each of the initial planes. After the room layout re-construction is performed, the initial 3D model is obtained, and finally, taking benefits of high quality of laser data and the distance between the wall surface-objects and the wall surface, wall surface-objects could be detected (whether there are virtual openings, windows, and opened/closed doors) and reconstructed to achieve high-level of details of complex indoor 3D modeling scenes, especially that the level of details involves special wall surface-objects. Advantageously, the method does not need any prior knowledge in advance, strengthens the recognition and re-construction of the specific form of the wall surface, and eliminates the interference of the blocking objects on the established model, particularly suitable for high-level of detail of indoor 3D modeling scenes with high complexity.

In the following detailed description, the method, system and device are merely exemplary in nature and are not intended to limit the disclosure or its application and/or uses. It should be appreciated that a vast number of variations exist. The detailed description will enable those of ordinary skill in the art to implement an exemplary embodiment of the present disclosure without undue experimentation, and it is understood that various changes or modifications may be made in the function and arrangement of methods, systems and devices described in the exemplary embodiment without departing from the scope of the present disclosure as set forth in the appended claims. The exemplary embodiments may not be limited to the precise embodiments described below, and may be practiced without some of these specific details. In other instances, structures and methods have not been described in detail, if already well known.

In the specification and the appended claims, the term "point cloud data" is a set of data that represent, for example, an object in Euclidean space.

The term "raw point cloud data" or "raw dataset" as used herein is collected by a laser scanner, preferably a backpack laser scanner, which is a type of the mobile and personal laser scanners for surveying indoor scenes. In one embodiment, other portable devices, such as a drone or a remote controlled robotic, having laser scanner attached thereto for continuously projecting laser pulses can be used to collect the raw dataset for performing 3D indoor modeling.

Unless specified otherwise, the terms "comprising" and "comprise", and grammatical variants thereof, are intended to represent "open" or "inclusive" language such that they include recited elements but also permit inclusion of additional, unrecited elements.

3D Indoor Modeling Method

Referring to FIG. 1, a flowchart of the 3D indoor modeling method based on point cloud data in accordance with certain embodiments of the present disclosure is depicted. The method comprises the steps of: (1) pre-processing S101; (2) local surface properties analysis S102; (3) 3D point segmentation S103; (4) initial 3D model re-construction S104; and (5) wall surface-object re-construction S105.

The step of pre-processing S101 further comprises the steps of down-sampling S201 and statistical outlier removal S202. The step of 3D point segmentation S103 further comprises the steps of region-based 3D point segmentation S203 and model-based 3D point segmentation S204. The step of initial 3D model construction S104 further comprises the steps of re-orientation and structural element detection S205; room clustering S206; and room layout re-construction S207. The step of wall surface-object re-construction S105 further comprises 2D projection & rasterization S208 and clustering & recognition S209.

When surveying an indoor scene, a laser scanner 13, preferably a backpack laser scanner, is used to acquire raw point cloud data (raw dataset) for a processor 12 to compute and re-construct a 3D model. However, the raw point cloud data contains redundant information due to the limitation of the collection device. Therefore, it is not appropriate to directly use the raw point cloud data for modeling. It is very important to remove the redundant information and construct a 3D model based on more optimized point cloud data. The first step for executing the indoor 3D re-construction is to perform pre-processing S101 the collected raw dataset, which can eliminate the noise and remove the outliers. In actual operation, various types of filters can be used to achieve the corresponding objective. In the present disclosure, down-sampling S201 and statistical outlier removal S202 are used to eliminate noise and other redundant information.

Down-sampling S201 is performed on the raw dataset to obtain down-sampled point cloud data. This embodiment provides a method for eliminating noise by down-sampling processing, which is also called under-sampling. This is an image processing method opposite to the up-sampling method, and its purpose is to increase the proportion of effective information by reducing the image.

In certain embodiments, down-sampling S201 is performed using voxelization, which converts the geometrical representation of an object into the voxel representation closest to the object, producing a volume dataset which not only contains the surface information of the model, but also can describe the internal properties of the model. The spatial voxels representing the model are similar to the 2D pixels representing the image, but extending from the 2D points to the 3D cubical unit. For any unstructured set of points $\mathbb{P}$ in 3D space $\mathbb{R}$ 3, the entire region is divided into small cubes with the same grid space $\mathfrak{d}$ in all directions. For each voxel $\mathbb{V}$ containing points (1, 2, 3, . . . , n), these points are replaced by one-point $\mathbb{P}$ using the arithmetic average of the desired characteristic.

Using this down-sampling S201 method does not change the whole trend of the shape, and the amount of data from millions of points can be reduced by 90% depending on the voxelization grid size being used, so as to achieve the purpose of eliminating noise as much as possible.

The statistical outlier removal S202 is used to remove outliers in the down-sampled point cloud data to obtain a processed point cloud data. These outliers can be detected based on their corresponding distances from their neighborhoods. In order to remove the outliers from the dataset, the location and scale parameters can be used for statistical analysis. Specifically, the median value of the locations and the mean absolute deviation (MAD) of the scale parameter are preferred. These two parameters are more robust compared with the average value of the location and the standard deviation of the scale parameter.

Afterwards, the processed point cloud data is used to generate normal vectors and curvature values by conducting local surface properties analysis S102. In particular, the step of conducting local surface properties analysis S102 uses local neighborhoods to estimate the two indicators of the processed point cloud data: normal vector and curvature value. As demonstrated by the covariance matrix analysis, these two indicators can be used to estimate the local surface properties of the point cloud data.

The covariance matrix (C) of the set of neighboring points (the 3D point coordinates are expressed as $(x_1, y_1, z_1) \ldots (x_k, y_k, z_k)$) in any 3D space estimated by the nearest neighborhood (k) can be written as:

$$C = \begin{bmatrix} x_1 - \bar{x} \ldots x_k - \bar{x} \\ y_1 - \bar{y} \ldots y_k - \bar{y} \\ z_1 - \bar{z} \ldots z_k - \bar{z} \end{bmatrix} \cdot \begin{bmatrix} x_1 - \bar{x} \ldots x_k - \bar{x} \\ y_1 - \bar{y} \ldots y_k - \bar{y} \\ z_1 - \bar{z} \ldots z_k - \bar{z} \end{bmatrix}^T \quad (1)$$

When we consider the eigenvector problem:

$$C * \upsilon_1 = \lambda_1 * \upsilon_1 \quad (2)$$

where:
$(\bar{x}, \bar{y}, \bar{z})$ is the center of the set of neighboring points;
$x_1-\bar{x}, y_1-\bar{y}, z_1-\bar{z}$ is the projection component of the distance between the point and the center of the neighboring point in the x-axis direction, y-axis direction and z-axis direction; and
$\upsilon$ is the eigenvector and $\lambda$ is the eigenvalue.

When there are three eigenvalues with the magnitude relationship $\lambda_0 \leq \lambda_1 \leq \lambda_2$ used to represent the change in a group of neighbors and the direction of the eigenvector, the curvature value, as represented by flattening (flattening($\sigma$)), can quantify this change using the following formula:

$$\text{flattening}(\sigma) = \frac{\lambda_0}{\lambda_0 + \lambda_1 + \lambda_2} \quad (3)$$

Flattening value can be obtained by simple derivation. It could be noted that the maximum flattening is equal to (⅓) which means that the points are isotropically distributed, and the minimum is equal to zero which means that all points are on the plane.

Based on the normal vectors and the curvature values, the processed point cloud data from the step of pre-processing S101 is then performed 3D point segmentation S103 to obtain each of the initial planes. The 3D point segmentation S103 aims to use the normal vector and the curvature value to segment the processed point cloud data into segments with the same characteristics, so as to further process them to obtain the planes. Specifically, the 3D point segmentation S103 is a hybrid segmentation method comprising region-based 3D point segmentation S203 for reducing the computation time and model-based 3D point segmentation S204 for estimating the planar surface.

Figure 4A:
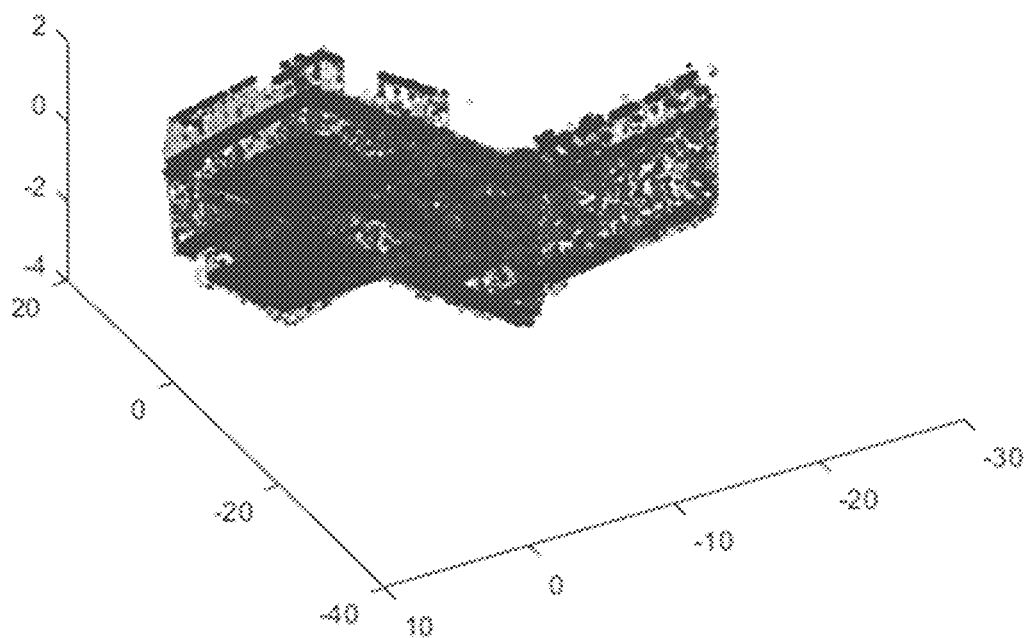
FIG. 4A is an exemplary result after conducting 3D point segmentation using region growing algorithm.

In the region-based 3D point segmentation S203, a region growing algorithm based on the normal vector and the curvature value is used to segment processed point cloud data into a plurality clusters: first, the region start by one seed point with minimum curvature; if the normal vector difference calculated according to the neighborhood is less than a preset threshold, the growth process adds the point to the region. After comparing all the points in the dataset, mark the region, then select a new seed and repeat the work until there are no unmarked points in the dataset. An exemplary result after conducting region-based 3D point segmentation using region growing algorithm is shown in FIG. 4A.

Each of the clusters is then processed by using model-based 3D point segmentation S204 to obtain each of the initial planes. The step of conducting model-based 3D point segmentation S204 applies the Random Sample Consensus (RANSAC) algorithm to detect primitives. In the 3D space ($\mathbb{R}$ 3), a plane equation consisting of a plane normal direction ($n_p$), 3D point coordinates ($p_{3D}$), and a constant term ($d_p$). The perpendicular projected distance ($l_p$) of any point and plane in a 3D space could be estimated using plane parameters as described:

$$\langle n_p, p_{3D}\rangle - d_p = 0, \left((n_p)_x, (n_p)_y, (n_p)_z\right) \quad (4)$$

$$(n_p)_x = \frac{(n_p)_x}{\left\|(n_p)_x, (n_p)_y, (n_p)_z\right\|_2}, \quad (5)$$

$$(n_p)_y = \frac{(n_p)_y}{\left\|(n_p)_x, (n_p)_y, (n_p)_z\right\|_2},$$

$$(n_p)_z = \frac{(n_p)_z}{\left\|(n_p)_x, (n_p)_y, (n_p)_z\right\|_2}$$

$$l_p = \frac{\langle n_p, p_{3D}\rangle - d_p}{\sqrt{(n_p)_x^2, (n_p)_y^2, (n_p)_z^2}} \quad (6)$$

Figure 4B:
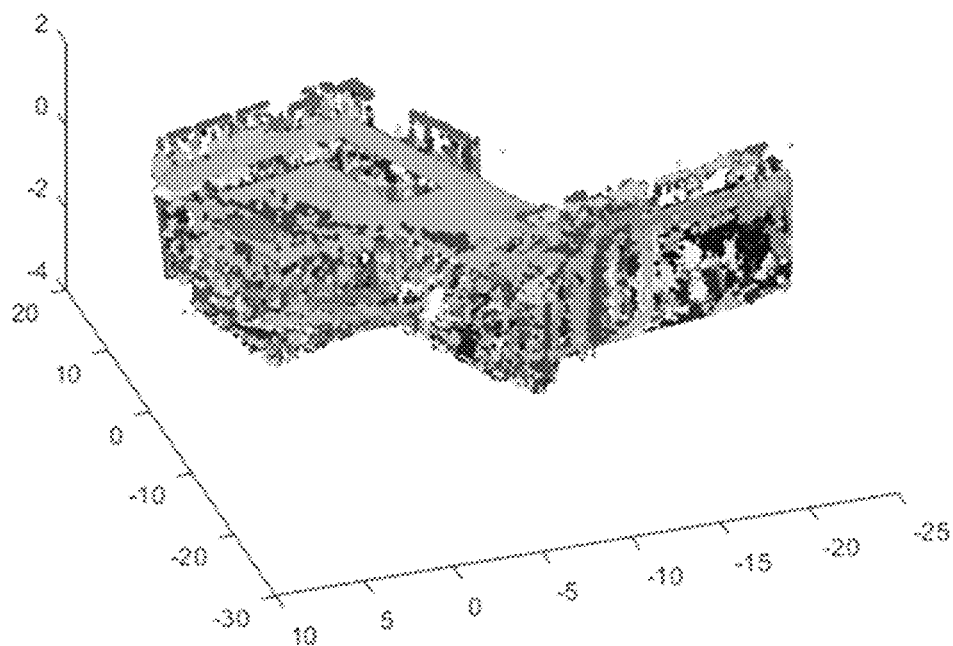
FIG. 4B is an exemplary result after conducting 3D point segmentation using the Random Sample Consensus (RANSAC) algorithm.

RANSAC is applied to region-based results by following these steps: three random points are selected to estimate plane parameters, checking all points with the perpendicular projected distance, and points within the threshold range will be counted with plane parameters. After several rounds of this operation, a model with a large number of points will be selected from all data as a primitive, and the operation will end when the region is less than the minimum predetermined threshold of points. Through the model-based 3D point segmentation S204, each plane of the entire indoor scene corresponding to the point cloud data can be obtained and outputted. An exemplary result after conducting model-based 3D point segmentation S204 using RANSAC algorithm is shown in FIG. 4B. The result is a plurality of planar surfaces for the entire indoor scene which need to be clustered in the following steps.

This step is to perform initial 3D model re-construction S104 based on the initial planes, comprising performing re-orientation and structural element detection S205; room clustering S206 of different room patches; and performing room layout re-construction S207 to re-construct the initial 3D model.

As the point cloud may contain noise, such noise affects the direction of the point cloud. Therefore, for the purpose of achieving accurate modeling, re-orientation of the detected primitives is performed.

First, the primitives that are almost in the vertical direction (align with the direction of the gravity) can be classified into wall planes, and other primitives are classified into the ceilings or floors based on their average height. Three dominant directions which are orthogonal will be selected from all detected planes based on orientation with respect to gravitational direction and number of points per plane. For any two coordinate systems (xyz & XYZ), the rotational matrix can be calculated based on the angle between each two similar directions ($\omega, \varphi, \kappa$). By applying re-orientation, the plane parameters can be adjusted, and the point cloud coordinates can be aligned to the real coordinate system, which helps to cluster the data into different room clusters.

Figure 5A:
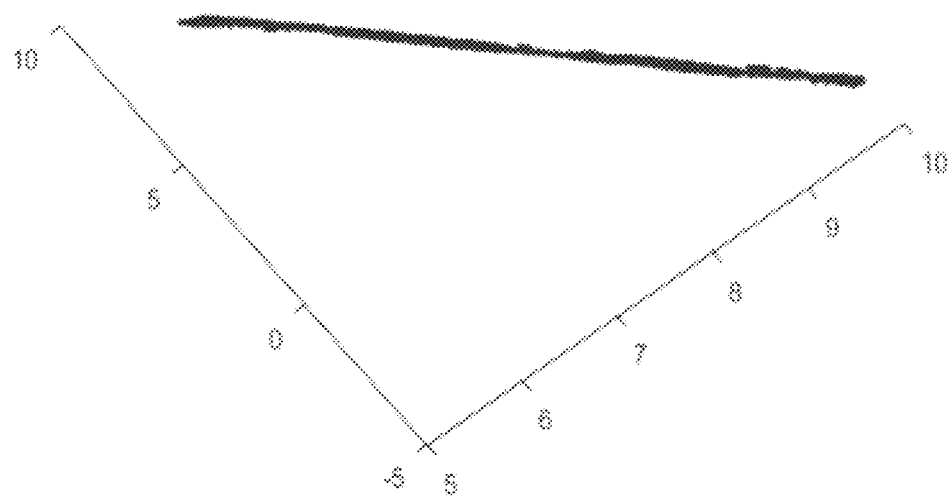
FIG. 5A is an exemplary result showing the top view of a wall plane after performing structural element detection of the vertical planes.
Figure 5B:
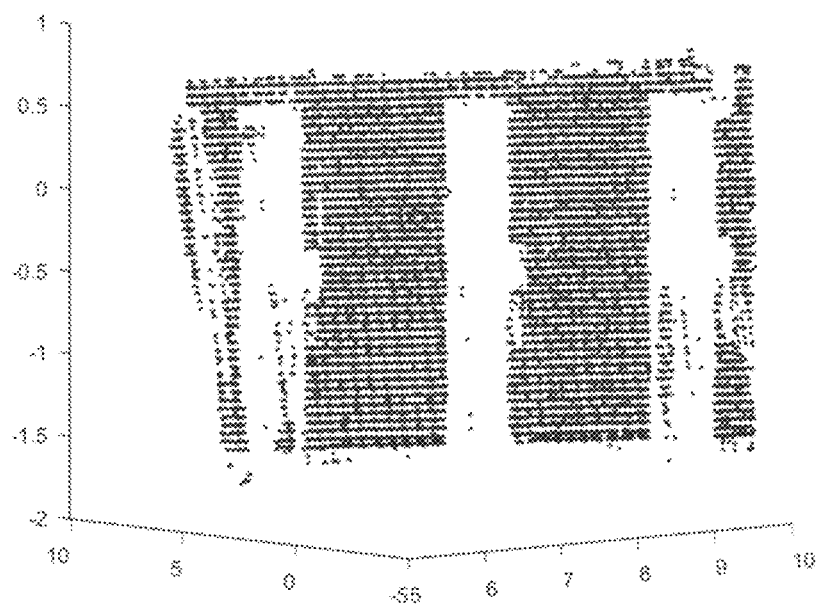
FIG. 5B is an exemplary result showing the side view of a wall plane after performing structural element detection of the vertical planes.
Figure 5C:
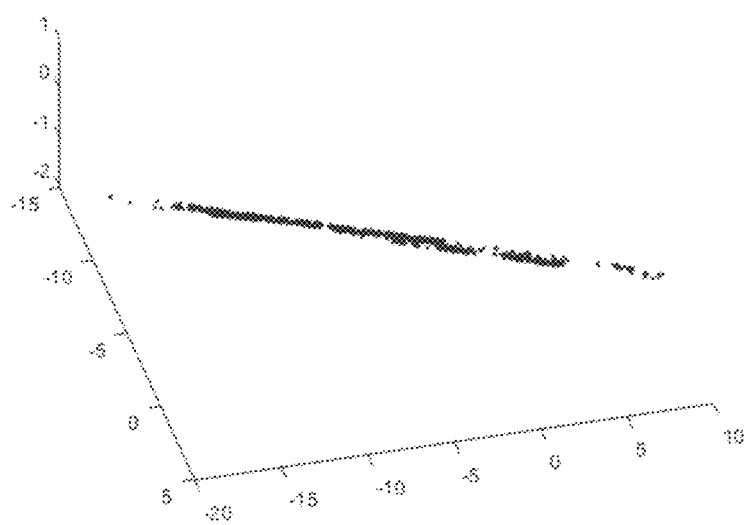
FIG. 5C is an exemplary result showing the top view of a fake plane after performing structural element detection of the vertical planes.
Figure 5D:
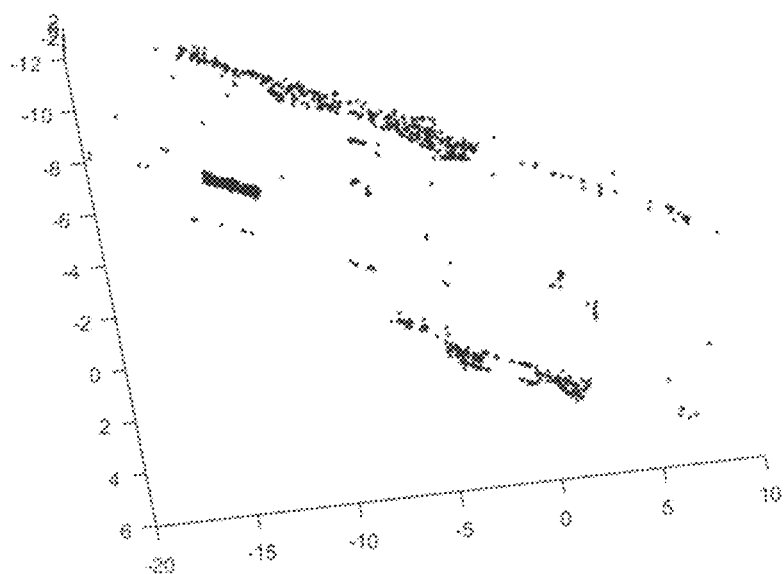
FIG. 5D is an exemplary result showing the side view of a fake plane after performing structural element detection of the vertical planes.
Figure 5E:
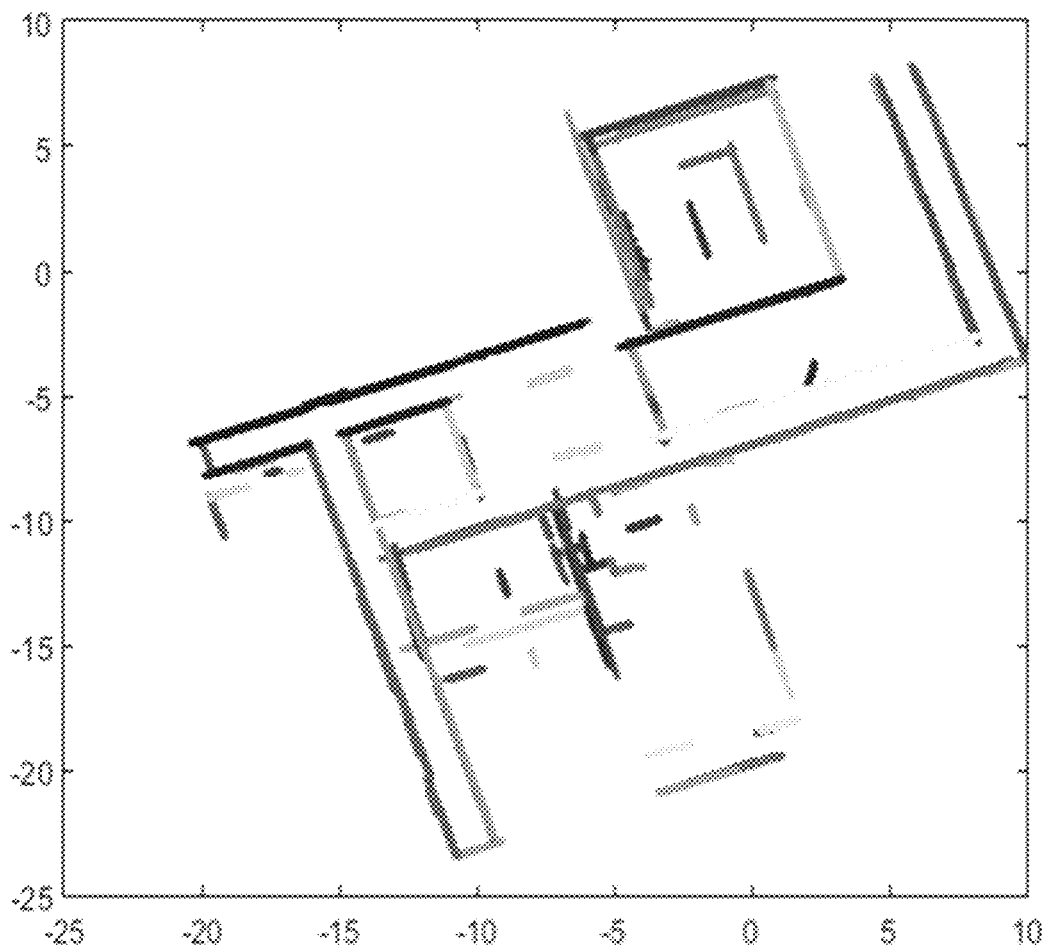
FIG. 5E is an exemplary result after performing structural element detection of the vertical planes.

Regarding the structural element detection, the vertical planes that are classified as wall structures are analyzed and some of them need to be pruned. Due to noise in the point cloud, some vertical planes may not belong to the wall structures. These planes will be pruned using region growth, histogram, and probability analysis. For each wall plane, region growth is applied to remove outliers from each wall plane. All points belong to the vertical plane will be projected onto that plane and rasterized using the predefined pixel size. The histogram on the 2D projected plane can be calculated, and the histogram can be converted to the binary system (0 for zero pixels, and 1 for other pixels). It is known that a wall plane has distribution points throughout the whole plane, as shown in FIGS. 5A-5B. Otherwise, it will be treated as a false plane as shown in FIGS. 5C-5D. Therefore, the probability distribution function will be estimated using non-empty cells. If the probability distribution function estimated by the non-empty cell exceeds a predefined threshold, the plane will be treated as a wall structure. An exemplary result after performing structural element detection of the vertical planes is shown in FIG. 5E.

Figure 6A:
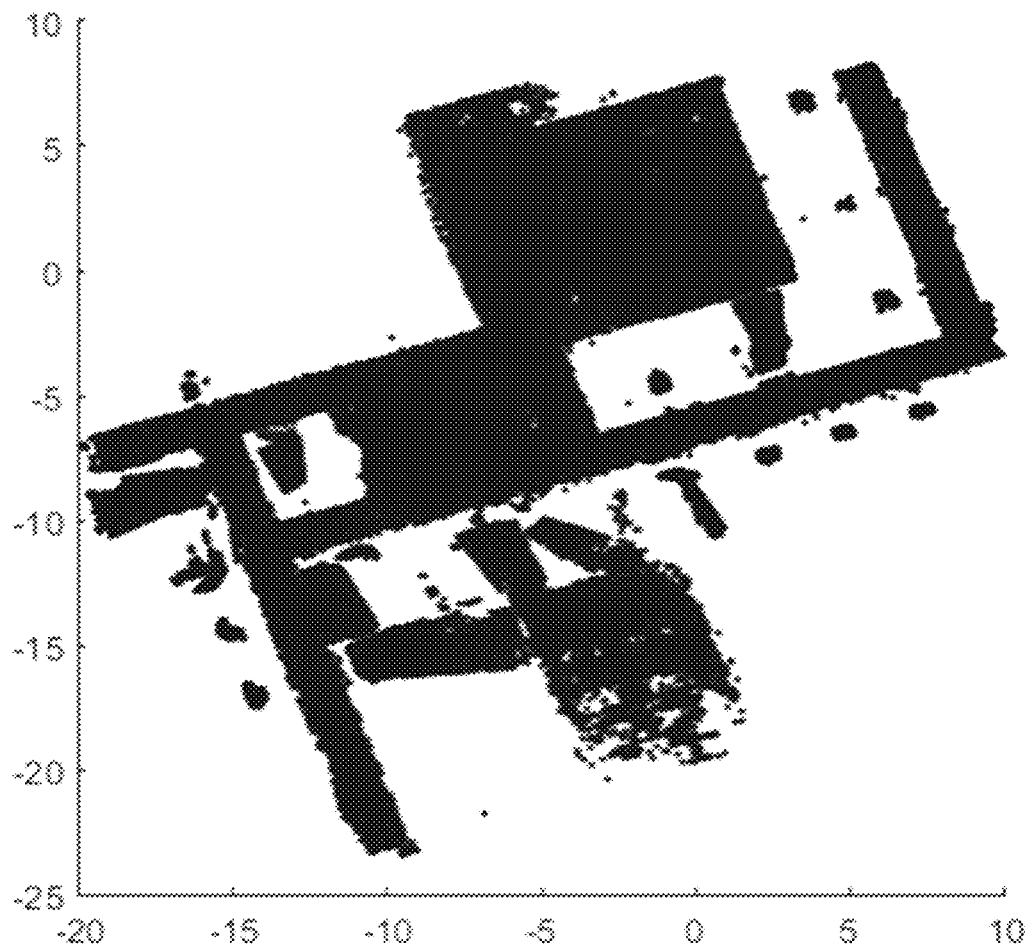
FIG. 6A is an exemplary ceiling plane for the clustering process.
Figure 6B:
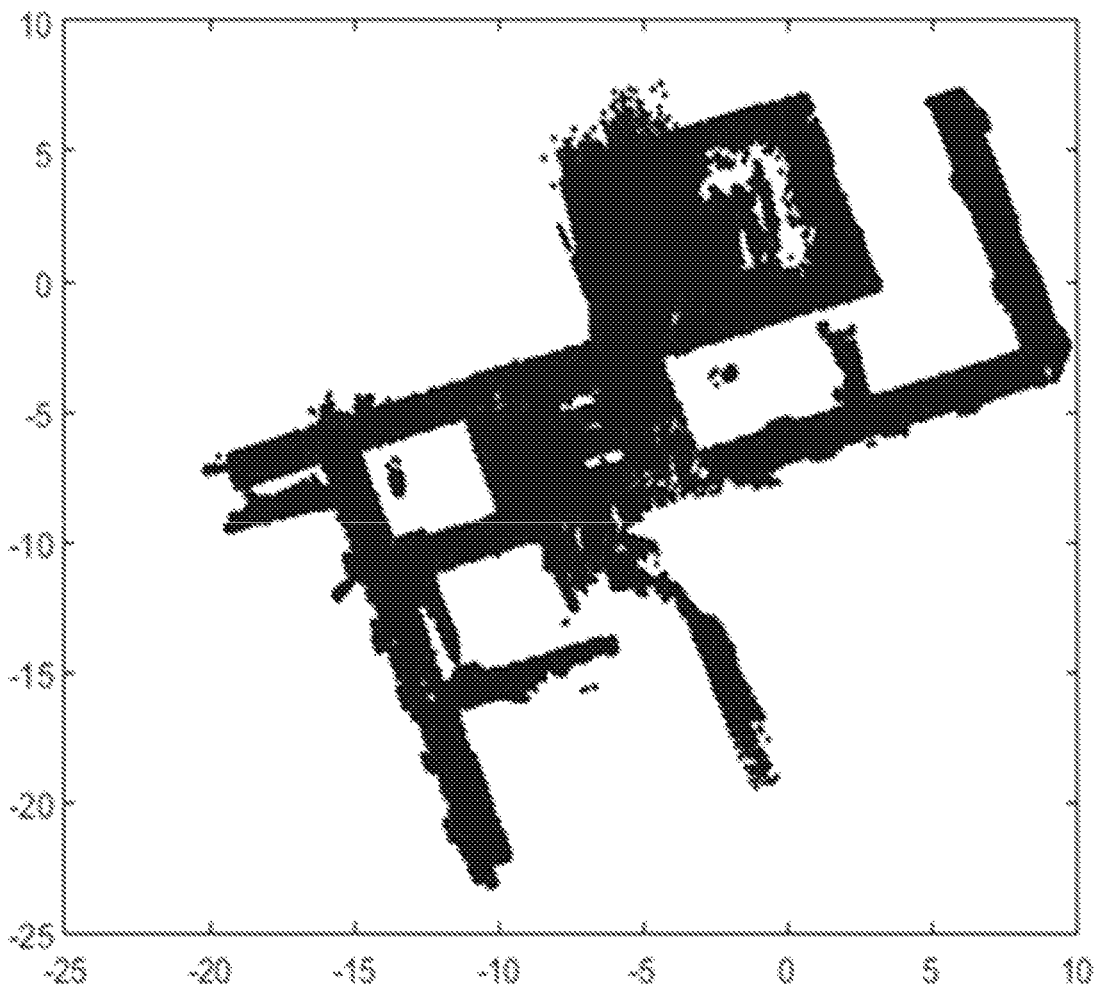
FIG. 6B is an exemplary floor plane for the clustering process.
Figure 6C:
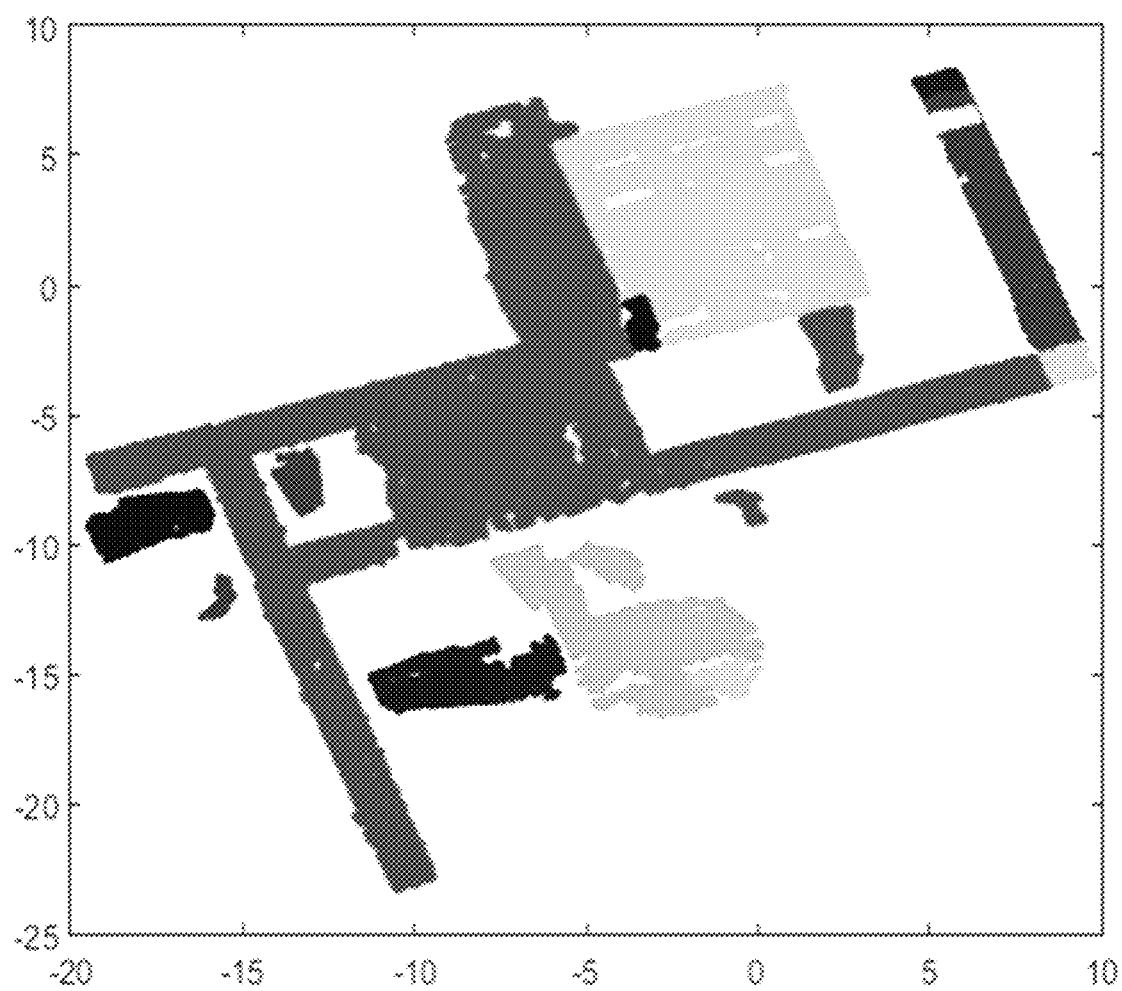
FIG. 6C is an exemplary result if there is over-segmentation on the ceiling plane.
Figure 6D:
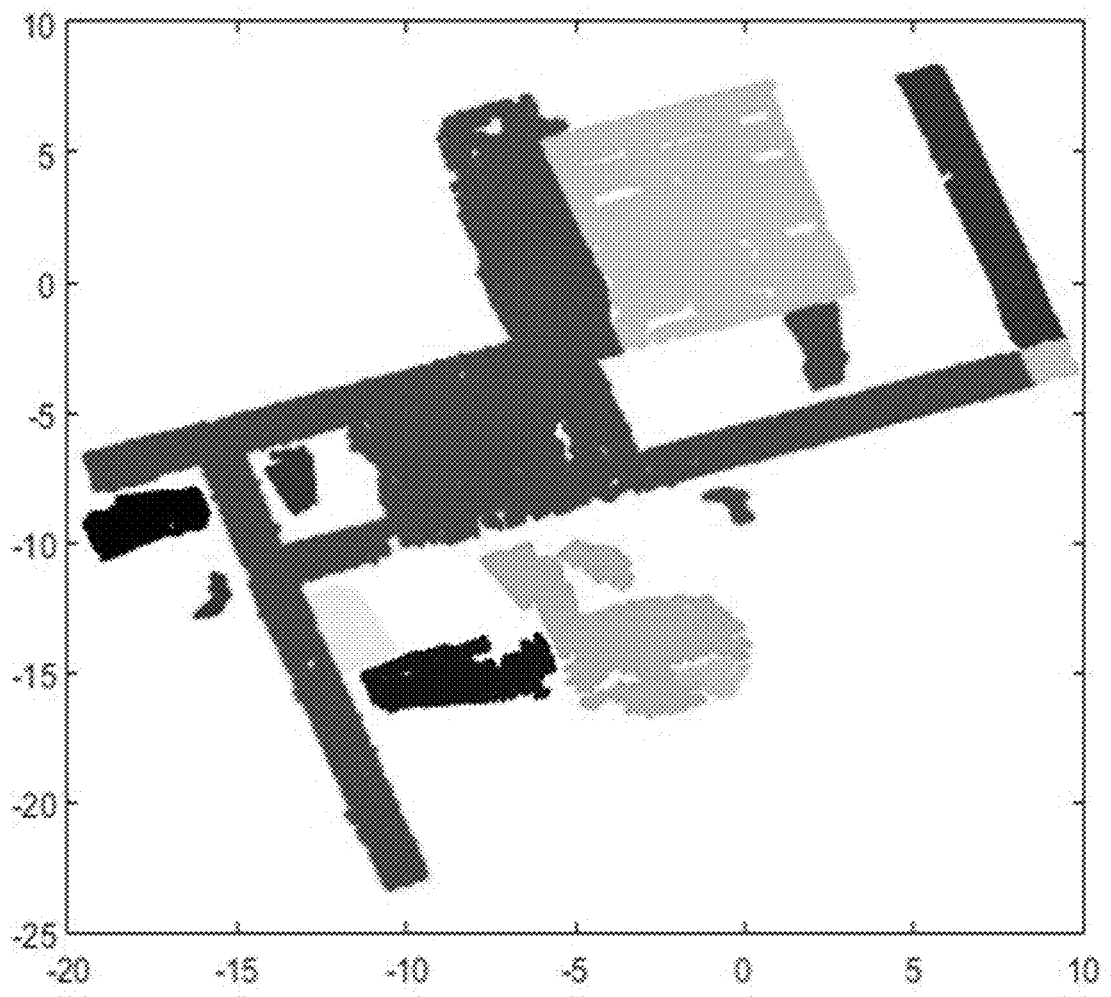
FIG. 6D is an exemplary result of cluster refining for the ceiling plane by merging all regions having overlapped area and having no wall segments.
Figure 6E:
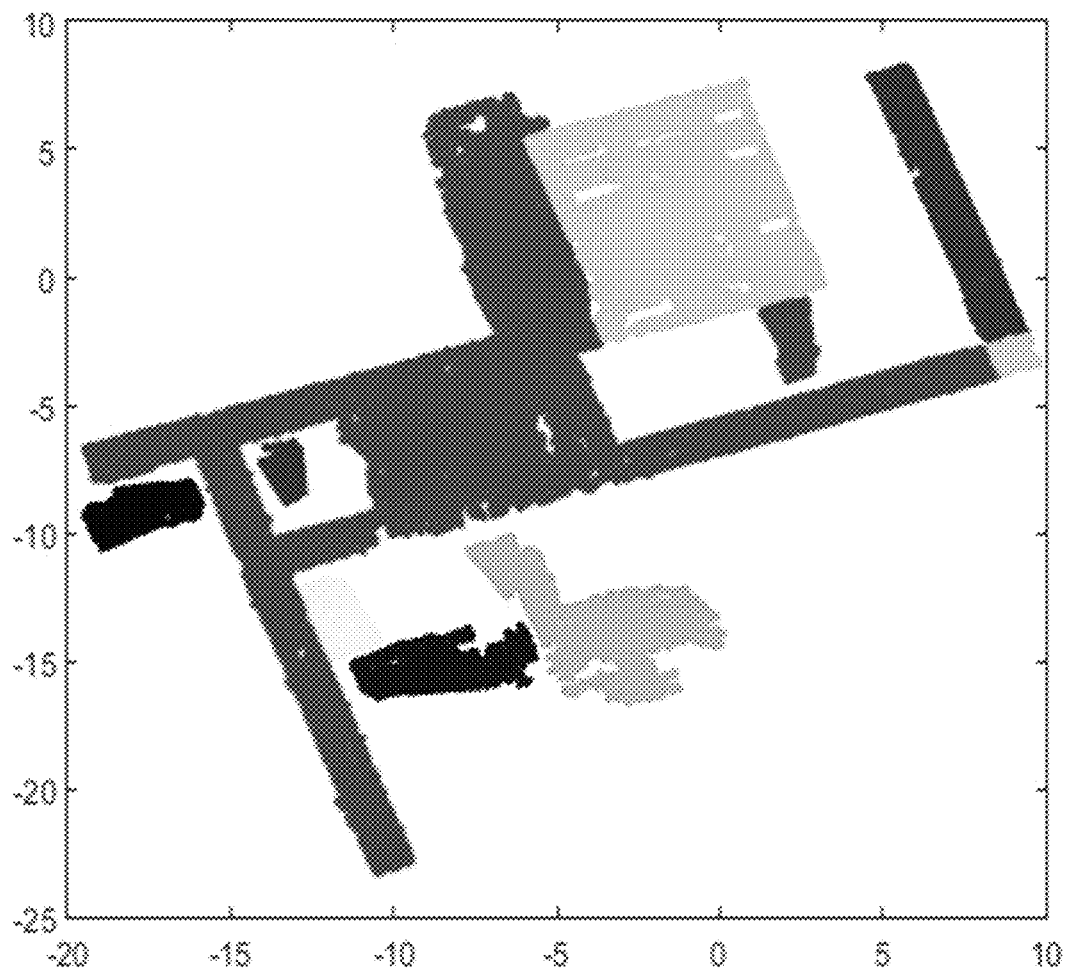
FIG. 6E is an exemplary result of cluster refining for the ceiling plane by discarding regions of small area.
Figure 6F:
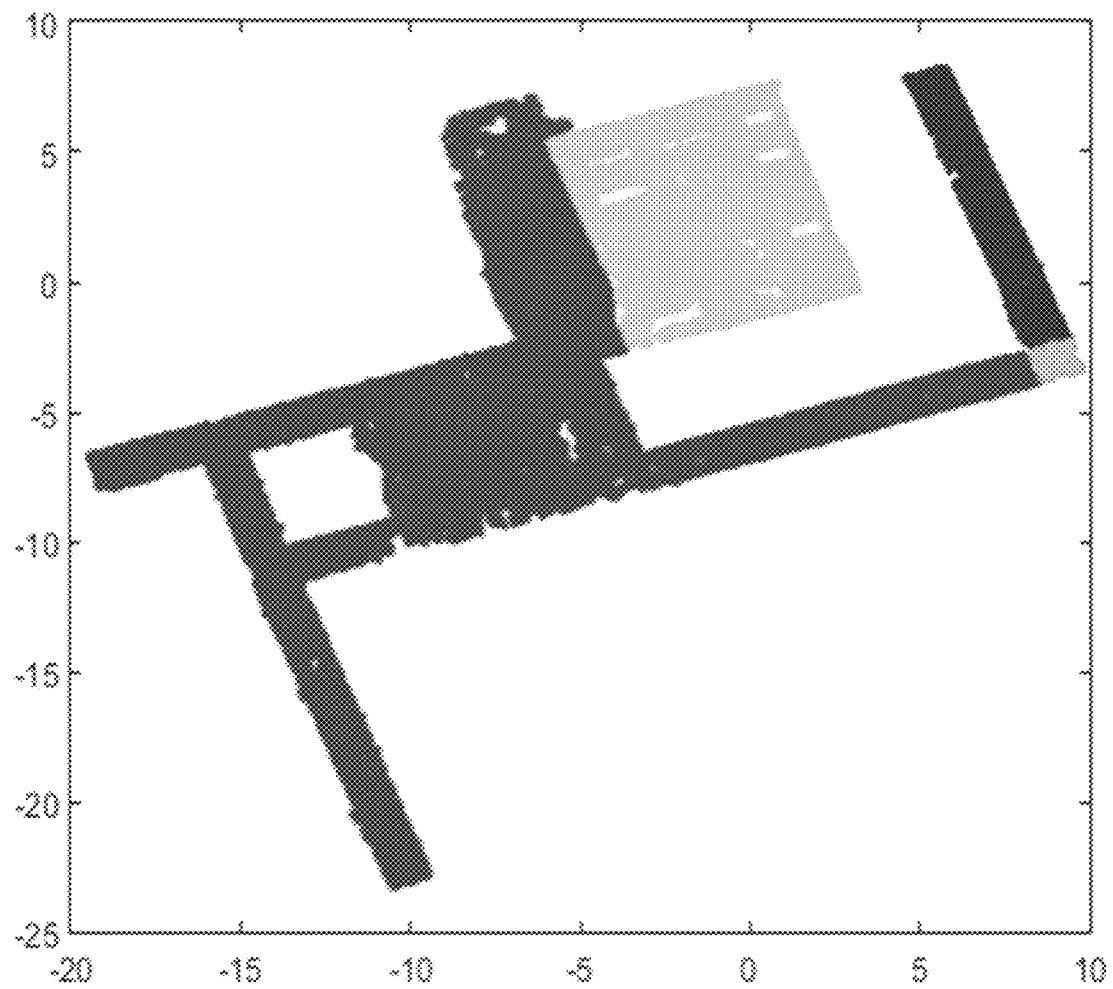
FIG. 6F is an exemplary result of cluster refining for the ceiling plane by discarding those regions that do not share predefined percentage of points with a floor plane.
Figure 6G:
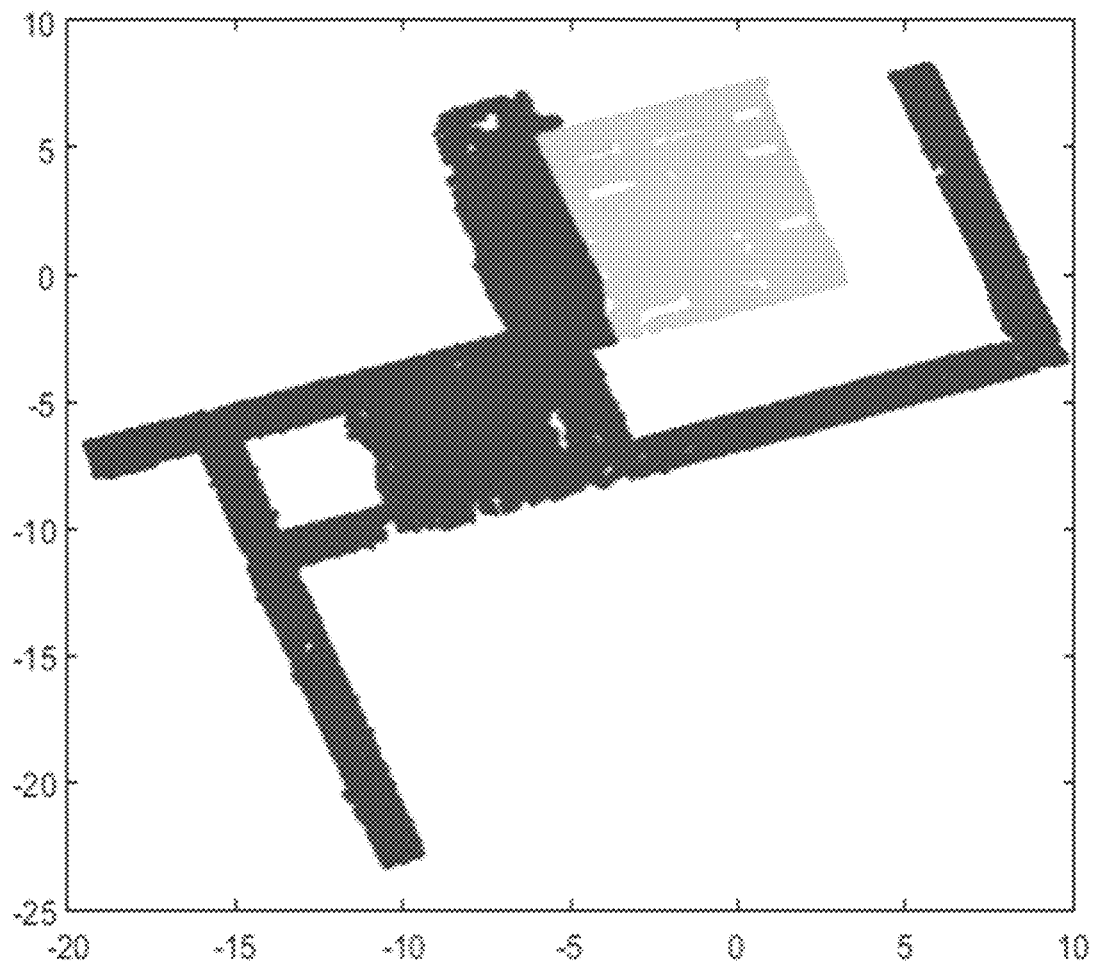
FIG. 6G is an exemplary result of cluster refining for the ceiling plane by merging those regions containing wall segments while their nearby area have no wall parts.

The next step is room clustering S206. Our clustering process depends mainly on ceiling plane as shown in FIG. 6A and floor plane shown in FIG. 6B while the wall planes will be used to adjust the clustered regions. The seed point is selected randomly. The region growing process is based on whether the Euclidean distance in the 3D space between the current point and the seed point is within a predefined threshold. If it is within the threshold, the points are added continuously to the region. Segmentation may lead to over-segmentation, as shown in FIG. 6C. Therefore, wall segments and floor planes are be used to refine the clustering process, comprising the following steps:
  (1) those regions with overlapped area and having no wall segments in a 2D space will be merged as one region, as demonstrated in FIG. 6D;
  (2) those regions containing wall segments, but the nearby region does not share points from the wall segment within threshold, are merged, as demonstrated in FIG. 6G;
  (3) those regions that do not share predefined percentage with floor plane points are discarded, as demonstrated in FIG. 6F; and
  (4) those regions with small area compared to a defined minimum area are discarded, as demonstrated in FIG. 6E.

The step for room layout re-construction S207 is performed based on the height information and the void area to re-construct 3D model of each of the rooms and obtain the initial 3D model. Room layout re-construction S207 comprises the step of: (1) boundaries re-construction S301; (2) in-hole re-construction S302; and (3) boundary line segments refinement S303.

Figure 7A:
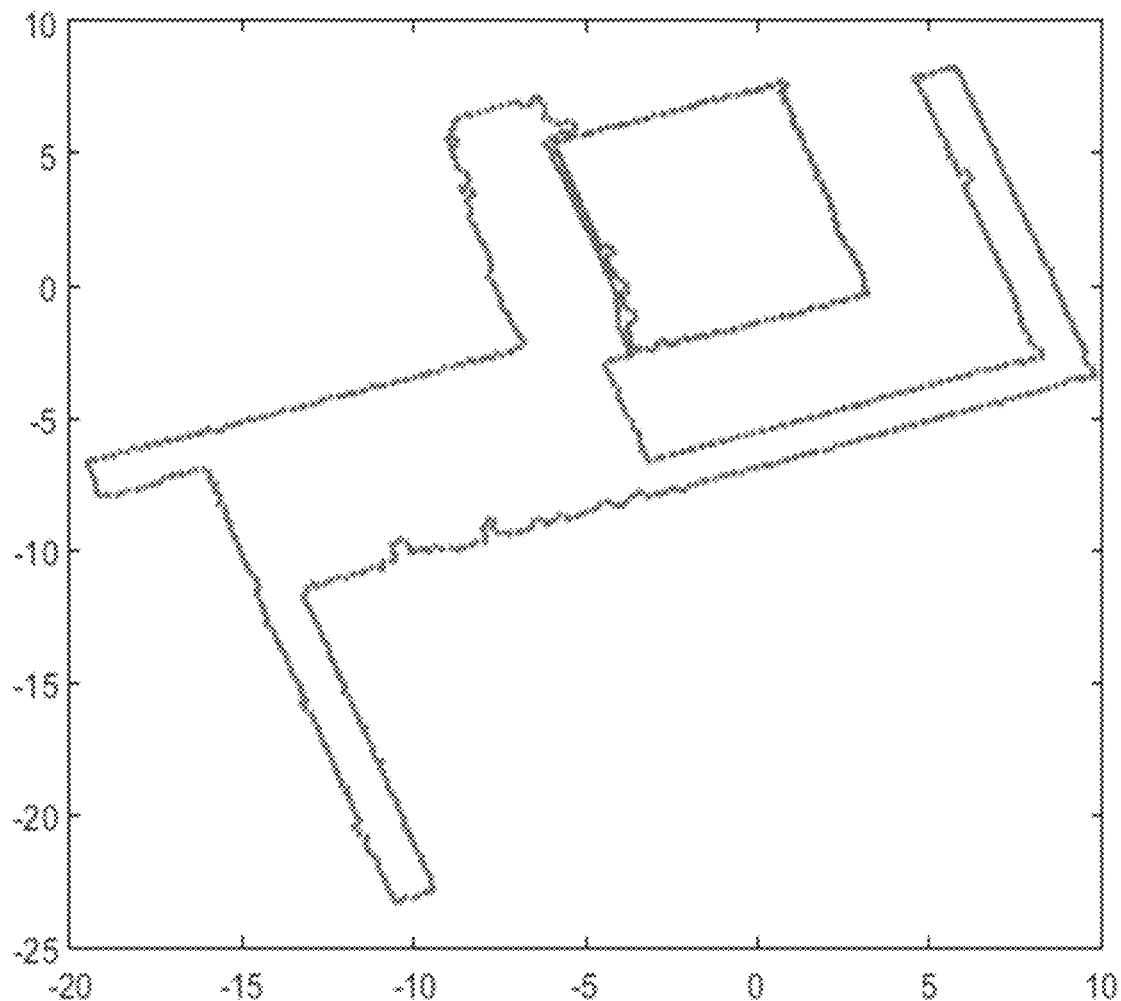
FIG. 7A is an exemplary result for performing boundaries tracing using modified convex hull algorithm.

In the boundaries re-construction S301, the boundaries for each region will be estimated in 2D space. First, tracing boundaries for each region is performed using a modified convex hull algorithm. Circle neighborhood is adopted using a predefined radius, and the lower point in the {y} direction is selected as the starting seed point. By following counter-clockwise (CCW) order, all boundary points can be added, as shown in FIG. 7A.

Figure 7B:
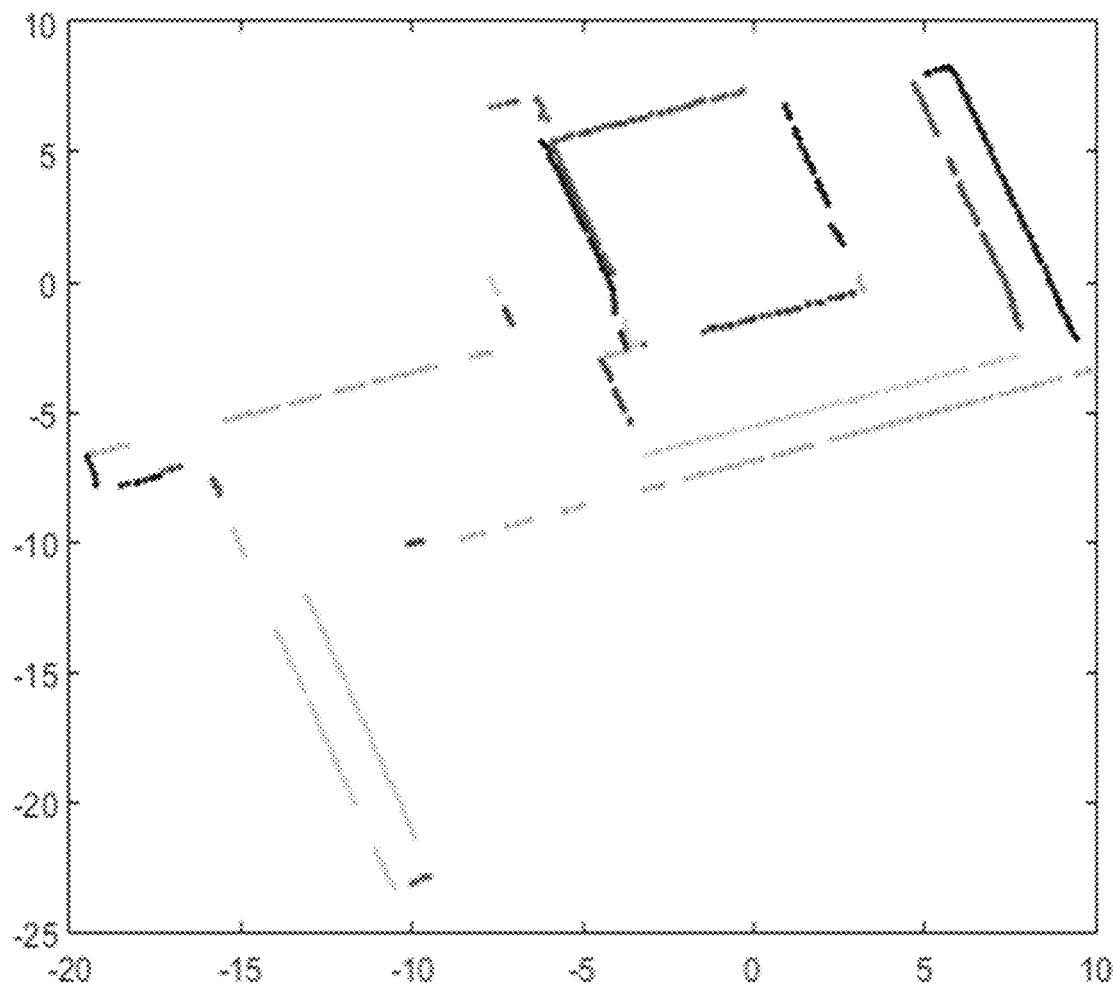
FIG. 7B is an exemplary result for performing boundary segments using line growing algorithm.
Figure 7C:
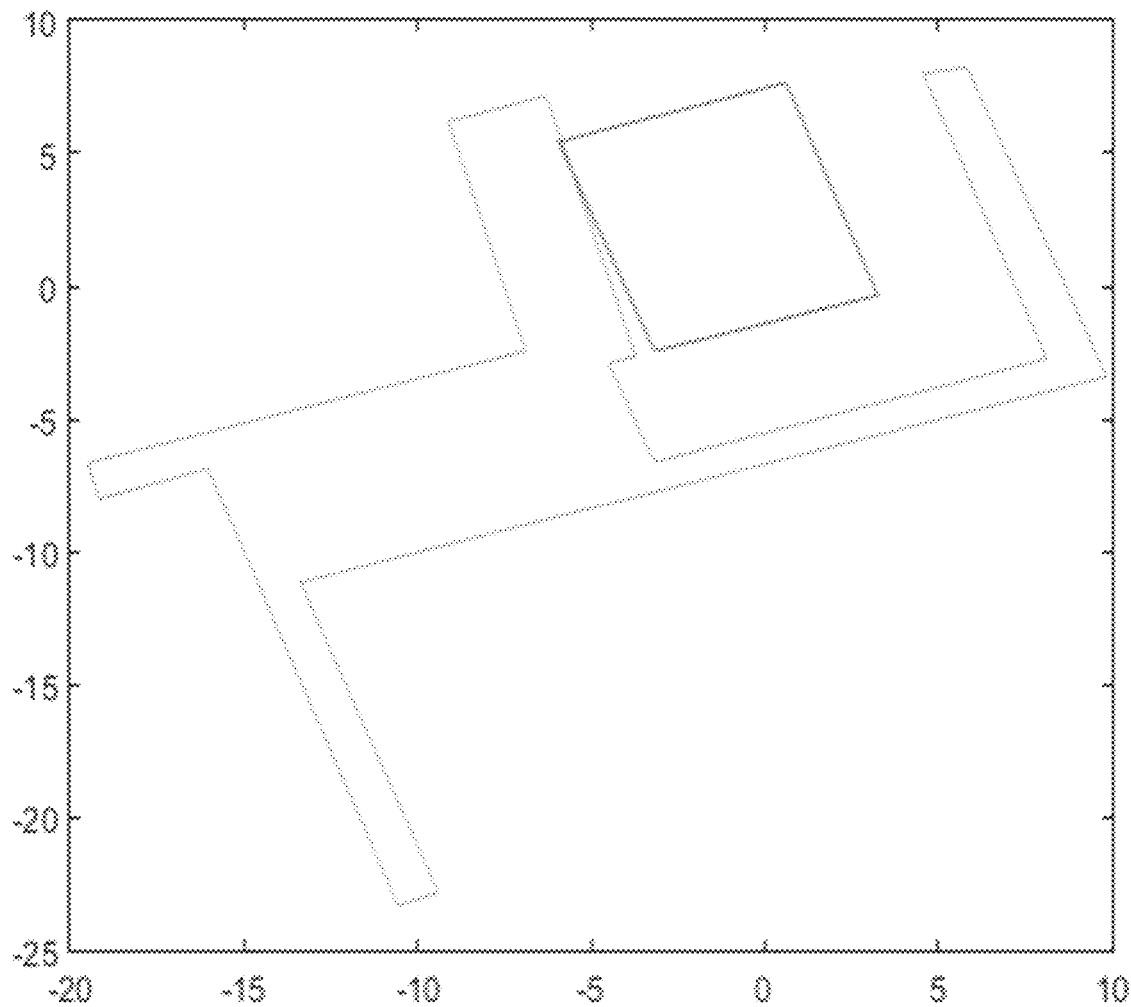
FIG. 7C is an exemplary result after performing boundaries re-construction.

Subsequently, these traced points will be filtered using line growing algorithm to detect collinear points of its corresponding lines using projected perpendicular distance (PPD) and 2D line equation, as shown in FIG. 7B. The detected line segments will be intersected to determine the room layout shape (FIG. 7C). The specific formulas are:

$$A*x+B*y+1=0 \quad (7)$$

where Equation (7) is an equation of the line in the 2D space; and $$PPD = \frac{|A*x + B*y + 1|}{\sqrt{(A^2 + B^2)}} \quad (8)$$

In the above Equations (7) and (8), A and B are line parameters, while x and y are 2D coordinates of a point on the line.

Figure 7D:
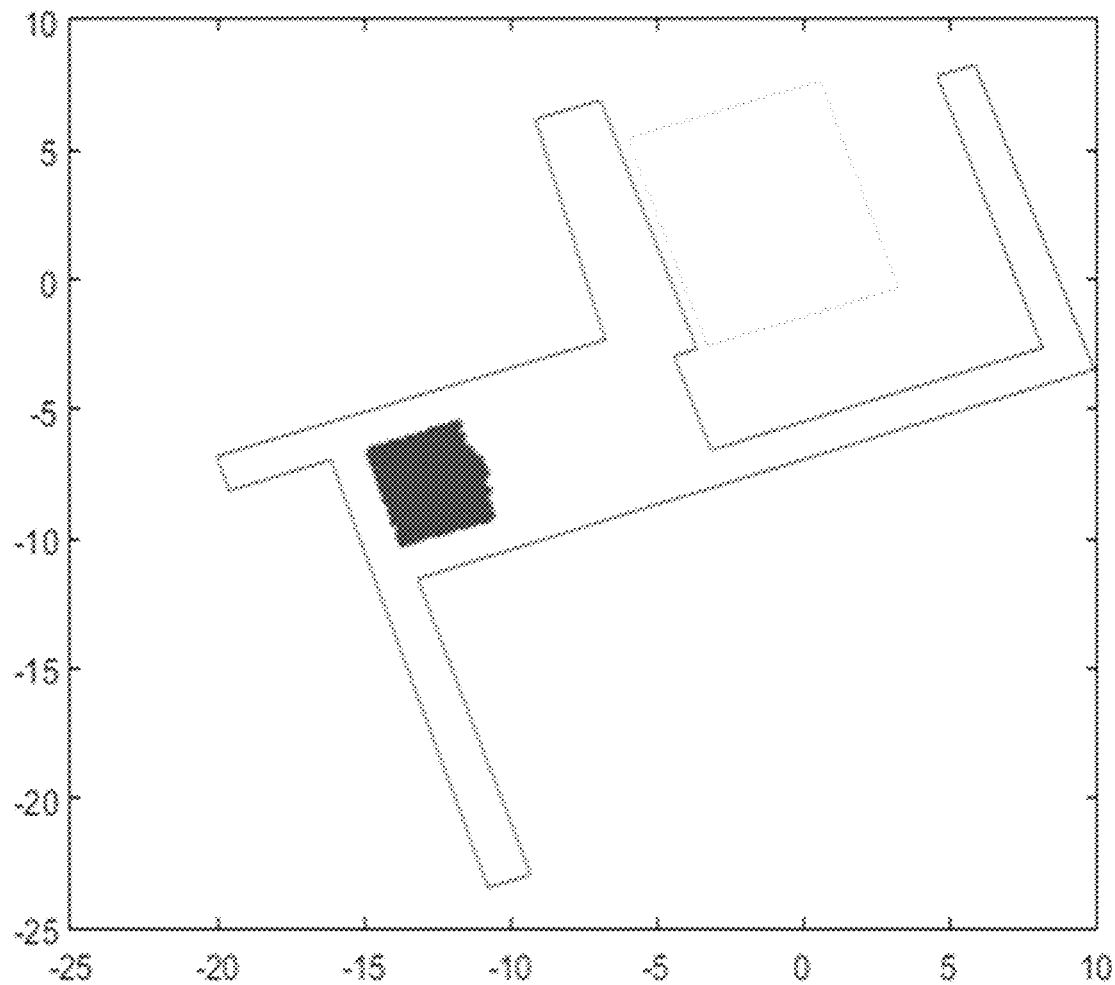
FIG. 7D is an exemplary result for performing in-hole re-construction.
Figure 7E:
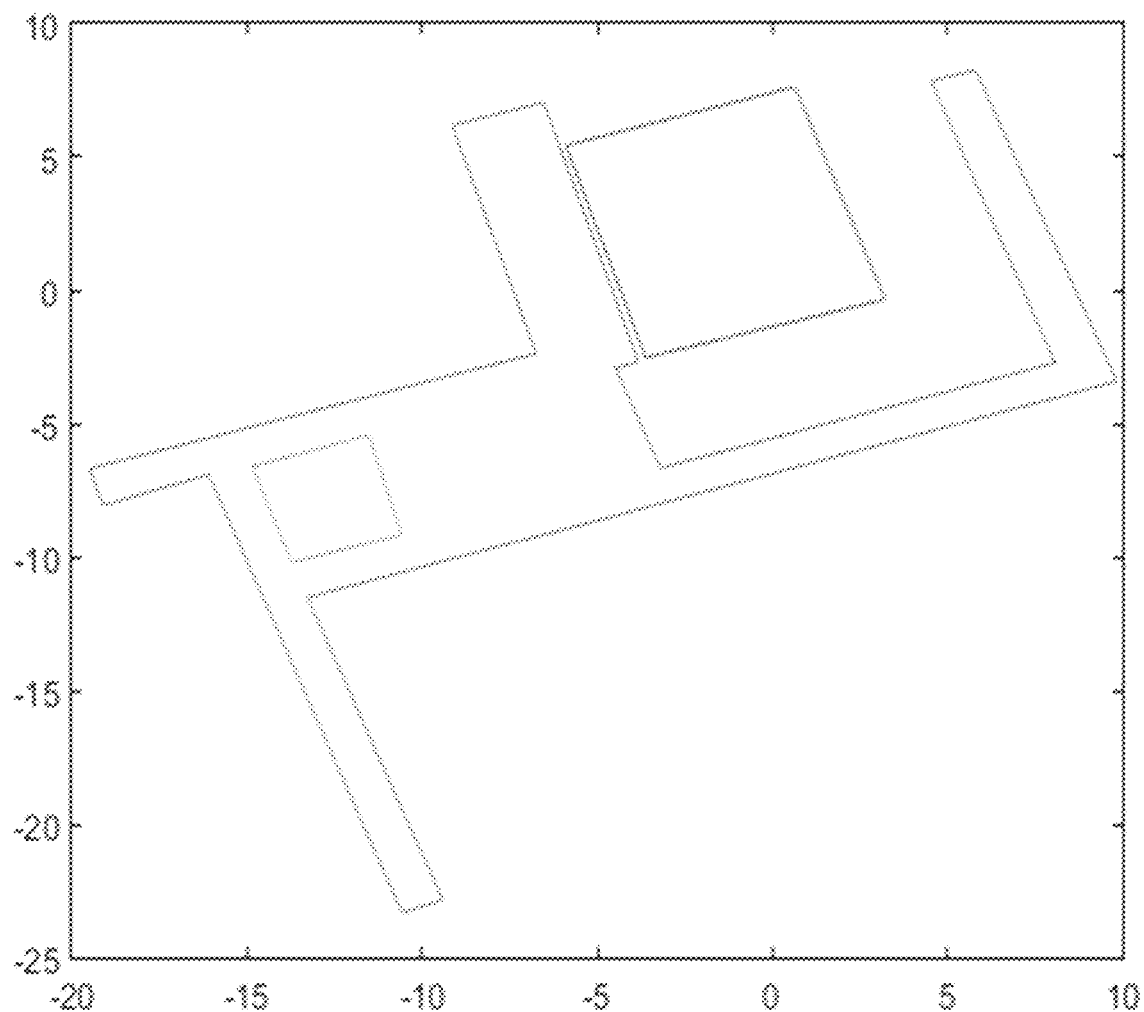
FIG. 7E is an exemplary final result of the boundary after performing in-hole re-construction.

In the in-hole re-construction S302, after determining all boundaries for each plane, sometimes the room may contain ventilation hole, or not all rooms are scanned due to other factors. As the previous step of detecting outer boundaries for each room segment, this step will attempt to determine voids using the plane of ceiling. All ceiling points are projected into the 2D space and rasterized using the pre-defined pixel size, empty pixels will be used and region growing algorithm will be applied for hole detection. The procedures of boundary re-construction S301 will be implemented to detect void boundaries, as shown in FIGS. 7D and 7E.

Figure 8A:
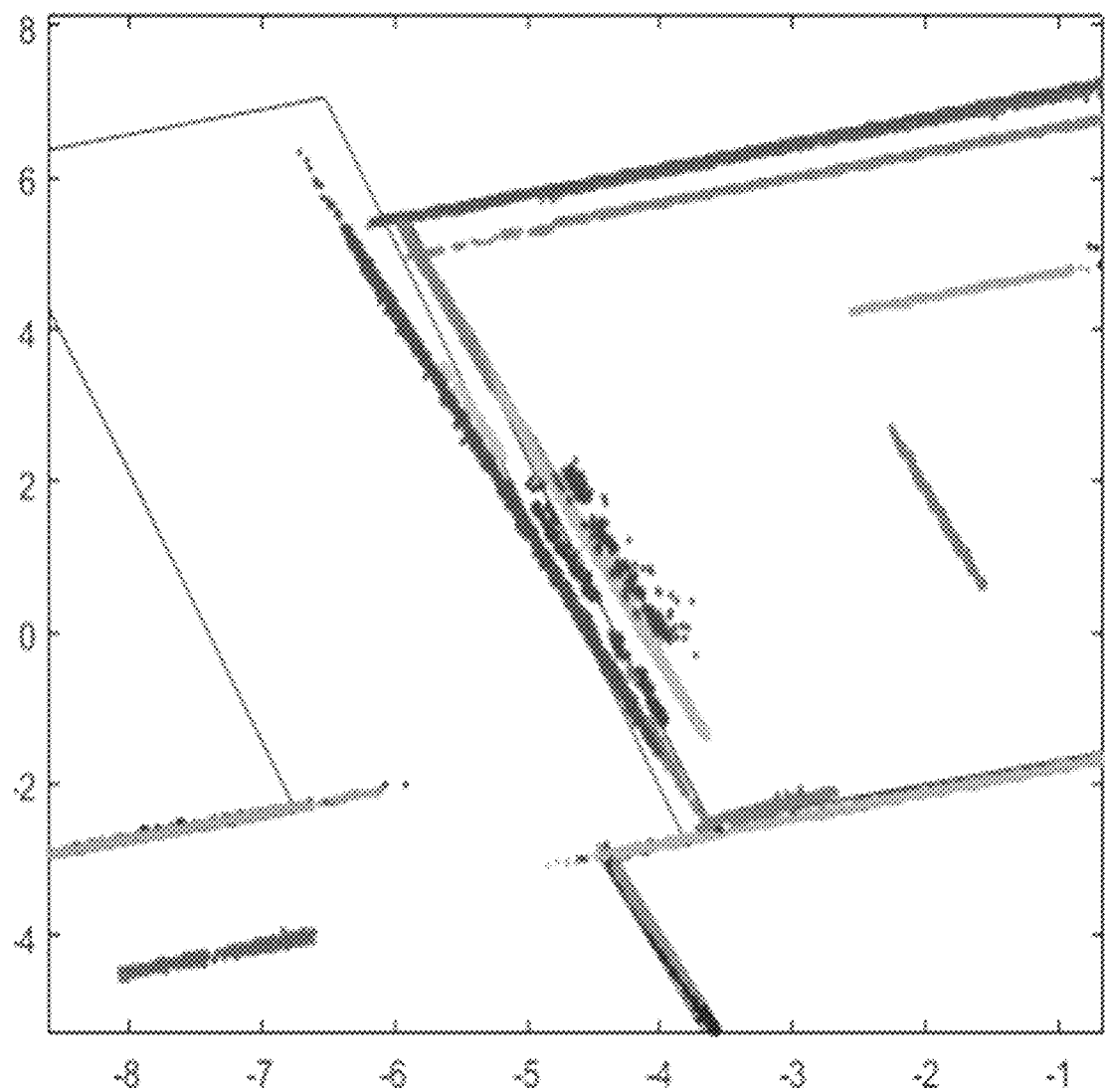
FIG. 8A is an image before performing boundary line segments refinement.
Figure 8B:
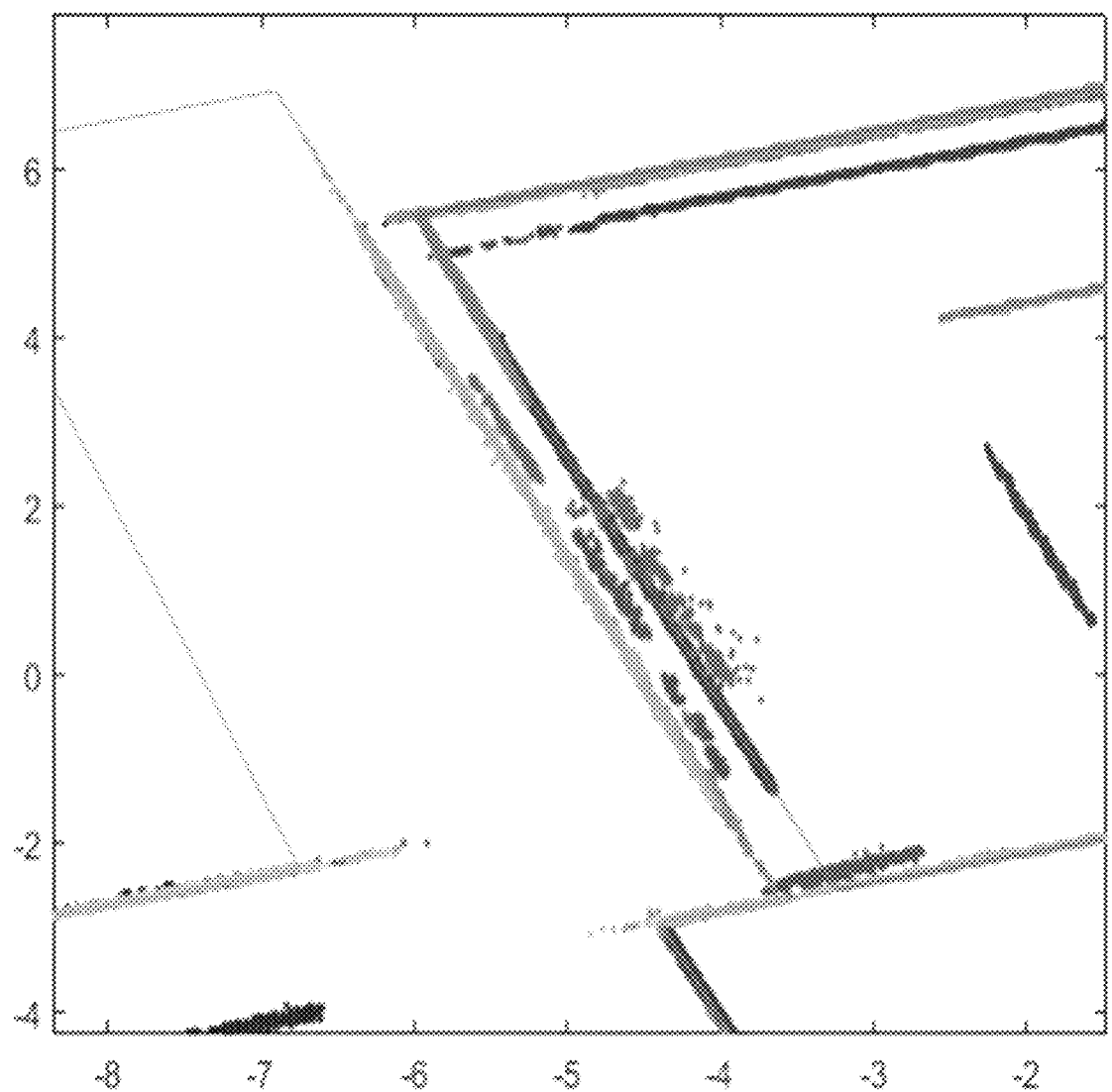
FIG. 8B is an exemplarily result after performing boundary line segments refinement on the image of FIG. 8A.

In the boundary line segments refinement S303 step, as points near boundaries will have high surface variation, they may be discarded during the segmentation process. This leads to misalignment of the room boundaries. Therefore, refinement step of these boundary lines are required. In that step, wall planes are projected in 2D space. Line boundaries can be adjusted by the near projected wall plane parameters. If there is no nearby wall, its parameters will be used as new boundary line parameters. An original image is shown in FIG. 8A, and the difference of the refinement can be shown from the exemplarily result after performing boundary line segments refinement S303, as shown in FIG. 8B.

After the boundary line segments refinement S303, each room will have its height from their inner points for the planes of ceiling and floor. Structural elements of the whole dataset can be extracted by the end of this step, so an initial 3D model can be re-constructed accordingly.

The final step for building the 3D indoor model is to perform wall surface-object re-construction S105, which can identify the specific form of the wall surface for perfecting the initial 3D model based on the laser point cloud and the thickness difference between the wall surface-objects and the wall surface.

The step of identifying the specific form and optimizing the initial 3D model aims to supplement some complex scene information in complex indoor scenes, such as, wall information. As in actual indoor scenes, there may be openings in the walls for setting doors, windows, depressions and various objects in contact with the wall. Such information is collectively referred to as the specific form of the wall. Therefore, this step is equivalent to performing re-construction of the wall information.

Detecting voids in the wall is a critical step. The furniture may block part of the wall structure and these blocked parts will be detected as voids. Specifically, some useful information can be obtained from the laser pulses emitted by the laser scanner 13, as these laser pulses will not return from void locations (such as open doors, windows and other openings). In addition, the distance between the wall objects (such as doors or windows) and the wall will be used for closed door detection and the like to optimize the wall structure.

Figure 9A:
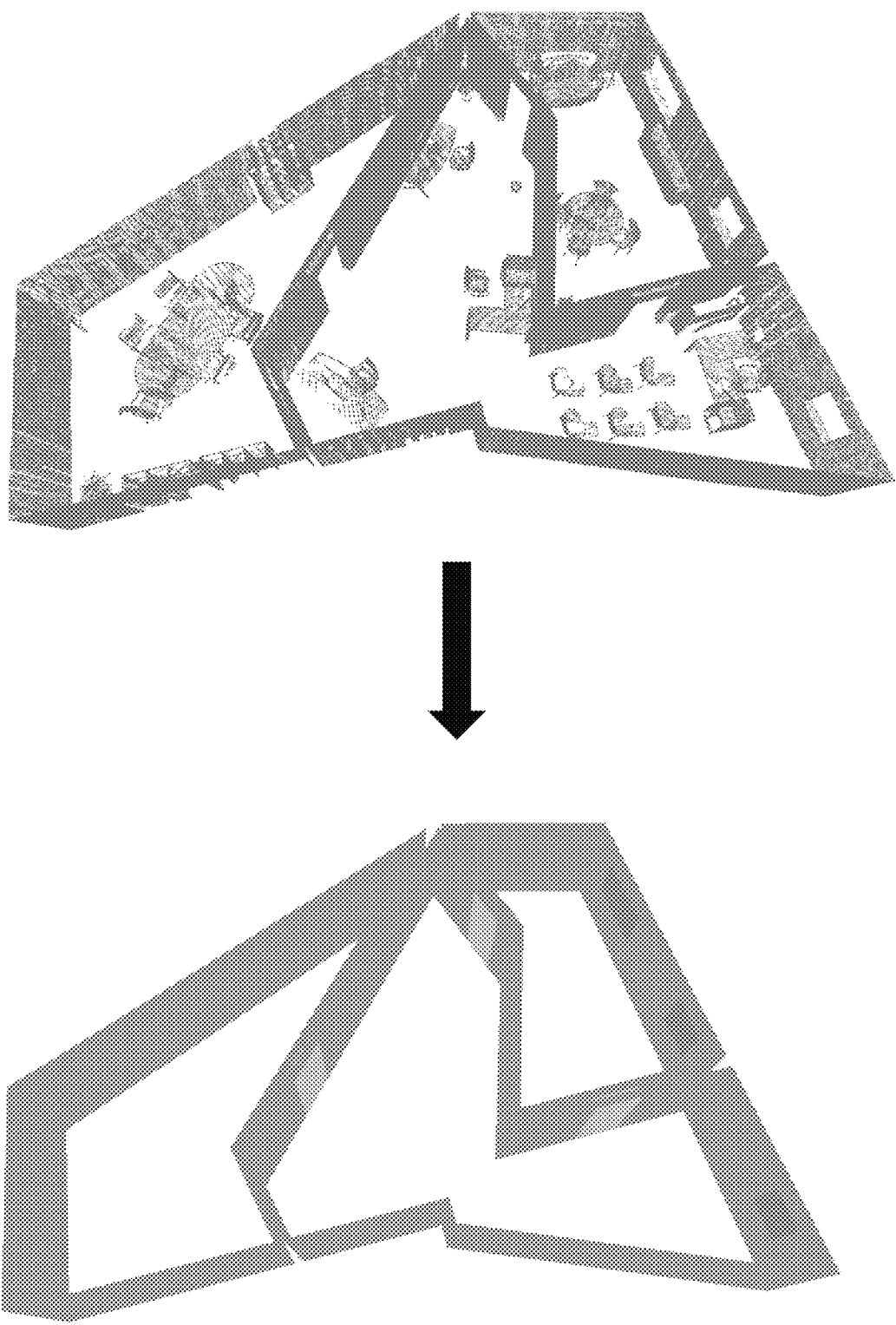
FIG. 9A shows the original data and the reconstructed model by reconstructing a visual model using synthetic raw dataset.
Figure 9B:
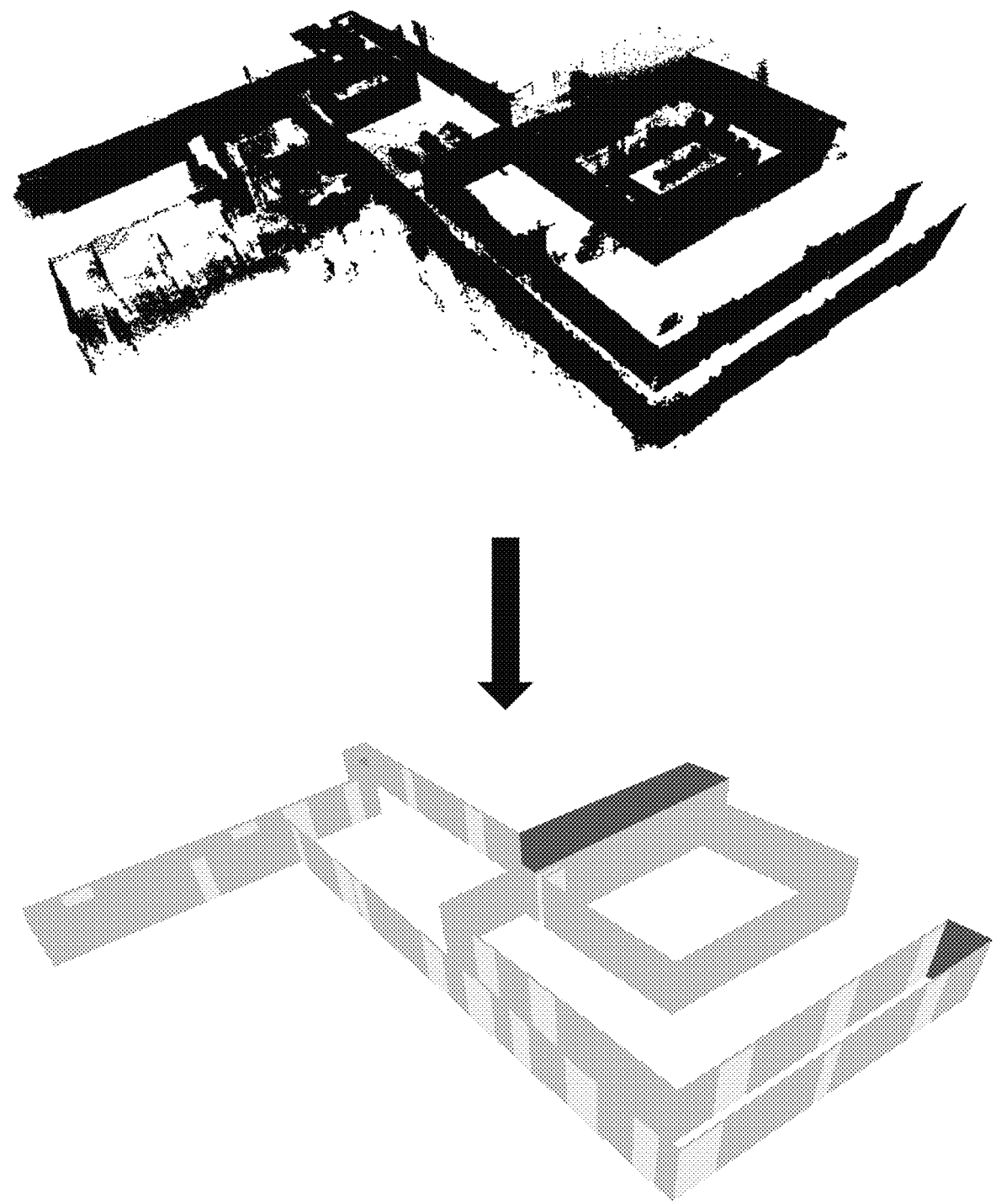
FIG. 9B shows the original data and the reconstructed model by reconstructing another visual model using raw dataset from backpack laser scanner.

The wall surface-object re-construction S105 further comprises the following steps: (1) 2D projection and rasterization S208; and (2) clustering and recognition S209. As shown in FIGS. 9A and 9B, two exemplary results after performing wall surface-object re-construction are provided.

In 2D projection and rasterization S208, with the use of the 2D projection equation and projected perpendicular distance, the point cloud data within the threshold distance (less than the wall thickness) is projected and rasterized onto the wall plane within its boundaries. Due to the interest in surfaces such as doors, windows or other openings, the process can be simplified into a 2D space with wall plane coordinates (height and length). The projected points will be rasterized using small windows that predefine threshold magnitude, and the histogram is estimated on the projected wall. From the histogram analysis, occupancy analysis can be used to redefine the wall surface. As the opening will show fewer points in the histogram, the opening can be defined according to this characteristic.

In clustering and recognition S209, our main work is to detect empty cells and differentiates between real wall surface-objects and fake wall surface-objects. Meanwhile, the detected empty space may not only represent the void in the wall (void area), but may also represent the part of the wall that is blocked (blocked area). To solve this problem, the threshold distance can also be used to implement the region growing algorithm, and then statistical analysis is used to adjust the cluster region. Predefined thresholds are used to apply region growth algorithm to distinguish different wall voids. Some detected voids may be caused by furniture blocking, so statistical analysis is performed for each cluster, and peak points in both wall directions are used to detect objects (wall surface-objects are assumed to have regular shapes).

By the end of modifying clusters, the void area has been identified as one of the wall surface-objects. For recognition part, five-dimensional features can be defined: maximum width, maximum height, lower height position, maximum height position, and density distribution of adjacent points within the maximum threshold away from the wall object, whereby the problem is converted to graph cut optimization, but with object-based, not cell-based.

The graph cut optimization is used to handle several objects by assigning a label to each object. The graph cut optimization converts the problem to a representation using binary numbers. If the object satisfies the required conditions, $\{1\}$ is assigned to the object, otherwise, $\{0\}$ is assigned instead. The clustered region will be represented on the image by nodes or vertices (V), and these nodes are connected by a set of edges (E). This node has two additional terminals $\{$source(s), and sink(t)$\}$, which are linked by n-link. The set $\{s\& t\}$ represents the foreground and background of the image. By minimizing the energy function, the graph cut optimization is used to label the terminal (s) as wall (w) or object (o).

$$E(f) = E_{data}(f) + E_{smooth}(f) \quad (9)$$

The energy function E(f) has both a data term $E_{data}(f)$ and a smoothness term $E_{smooth}(f)$ where the data term is responsible for controlling the object of the points within the distance threshold and using the probability density function with the normal distribution ($p(x|\mu,\sigma)$, where $\mu$ is the mean, $\sigma$ is the standard deviation) to cover the entire object. When the calculation result is greater than or equal to the maximum probability and greater than the percentage threshold $\tau_1$, it means that the points spread over the entire object.

$$p(x \mid \mu, \sigma) = \frac{1}{\sigma * \sqrt{2\pi}} e^{\frac{-(x-\mu)^2}{2\sigma^2}} \qquad (10)$$

$$E_{data}(f) = \begin{cases} 1 & if \ p(x \mid \mu, \sigma) \geq \tau_1 \\ 0 & other \end{cases} \qquad (11)$$

At the same time, the smoothing term consists of the analysis of the object (node) based on prior knowledge, and contains 3 sub-terms, as described below in Equation (12):

$$E_{smooth}(f) = E_a + E_{fc} + E_{lin} \qquad (12)$$

The 3 sub-terms in the smoothing term $E_{smooth}(f)$ are region sub-term ($E_a$), floor and ceiling sub-term ($E_{fc}$), and linear sub-term ($E_{lin}$).

The region sub-term penalizes nodes based on their total area (Area) according to the following formula, where $\tau_2$ is minimum area threshold:

$$E_a = \begin{cases} 0 & if \ \frac{Area}{\tau_2} \geq 1 \\ 1 & other \end{cases} \qquad (13)$$

The floor and ceiling sub-term penalizes the nodes whose center of gravity is close to the ceiling or floor based on the following formula, where $Z_c$, $Z_f$, $Z_u$, $Z_l$ and $\tau_3$ represent the height of the ceiling, the height of the floor, the height of the highest and lowest points among the nodes, and the minimum distance threshold:

$$E_{fc} = \begin{cases} 1 & if \ z_c - 0.5 \times (z_u + z_l) \leq \tau_3 \\ 1 & if \ 0.5 \times (z_u + z_l) - z_f \leq \tau_3 \\ 0 & other \end{cases} \qquad (14)$$

If the ratio of length to width is greater than the threshold $\tau_4$, the linear sub-term is penalizes the nodes based on the following formula:

$$E_{lin} = \begin{cases} 1 & if \ \frac{length}{width} \geq \tau_4 \\ 0 & other \end{cases} \qquad (15)$$

The thresholds ($\tau_1$, $\tau_2$, $\tau_3$, $\tau_4$) used in the above formulas need to be set after analysis based on the processed data. The energy function assigns the minimum energy to the associated tag (O), otherwise assigns it to the specified tag (w). After removing non-surface objects, the next step is to assign these objects as windows, doors or other openings based on the distance between the lower height and the floor and the maximum width of the door.

Accordingly, a 3D indoor modeling method is provided. The 3D indoor modeling method can be summarized into four stages: (1) pre-processing phase for the raw point cloud data; (2) 3D point segmentation phase; (3) room layout re-construction phase; and (4) wall surface-object re-construction phase for obtaining the 3D indoor model with additional details related to the wall surface-objects.

In accordance with certain embodiments, in the 3D point segmentation phase, region-based segmentation is conducted by using the predetermined thresholds of the normal vector and curvature value to reduce the operation time, and then the segmented data is used to estimate primitive planes by using RANSAC model-based segmentation.

The room layout re-construction phase is achieved by decomposing cluster data of multiple rooms into individual rooms. The detected units are first classified into the main structural elements: floor, ceiling and wall, and are redirected according to the relationship between the normal vector of the structural element and the vertical direction. Region growth, histogram and probabilistic analysis are used to improve wall classification. The point cloud of each classified wall will be projected onto its corresponding plane and all points are represented in the 2D cells through the histogram. By estimating the probability of empty and non-empty cells, if the probability of a non-empty cell is higher than the probability of an empty unit, the classification will be retained. The ceilings are clustered using region growth, and the adjusted wall segments besides floor segment are used to refine the clustering process according to the following four steps: (1) merging all regions that have overlapped region without partition walls; (2) merging all regions that share the same wall segment but there is wall segment in the overlapped area; (3) discarding all regions where the point cloud is less than the predefined percentage corresponding to the floor; and (4) discarding those smaller clusters area.

After adjusting the ceiling, the improved convex hull algorithm and line growth algorithm are used to construct the 2D boundaries. The same wall segment adjustment procedure is used to perform the void re-construction to estimate the void regions in the rooms, and then the neighboring adjusted wall segments are used to adjust the room boundaries. At the end of this step, 3D re-construction is conducted for all rooms using their layout.

In the final stage of wall surface-object re-construction phase, an algorithm for enriched wall surface-objects is conducted to identify the specific form of the wall. The wall surface-object re-construction phase consists of three main steps: (1) projection and image rasterization, (2) empty space recognition and clustering, and (3) wall surface recognition. The algorithm processes each individual wall, and estimates the predefined threshold to detect the empty space by projecting and rasterizing its plane, and then all detected regions are clustered. The graph cut optimization assigns these empty clusters to different wall surface-objects, using five features: maximum width, maximum height, lower height position, maximum height position, and density distribution of adjacent points within the maximum threshold away from the wall object. The clustered region will be represented on the image by nodes or vertices (V), and these nodes are connected by a set of edges (E). This node has two additional properties {source(s) and sink(t)}, which are linked by n-link. The set {s&t} represents the foreground and background of the image. By minimizing the energy function, the graph cut optimization is used to label the terminal (s) as wall (w) or object (o).

Application and Structural Block Diagram

Figure 2:
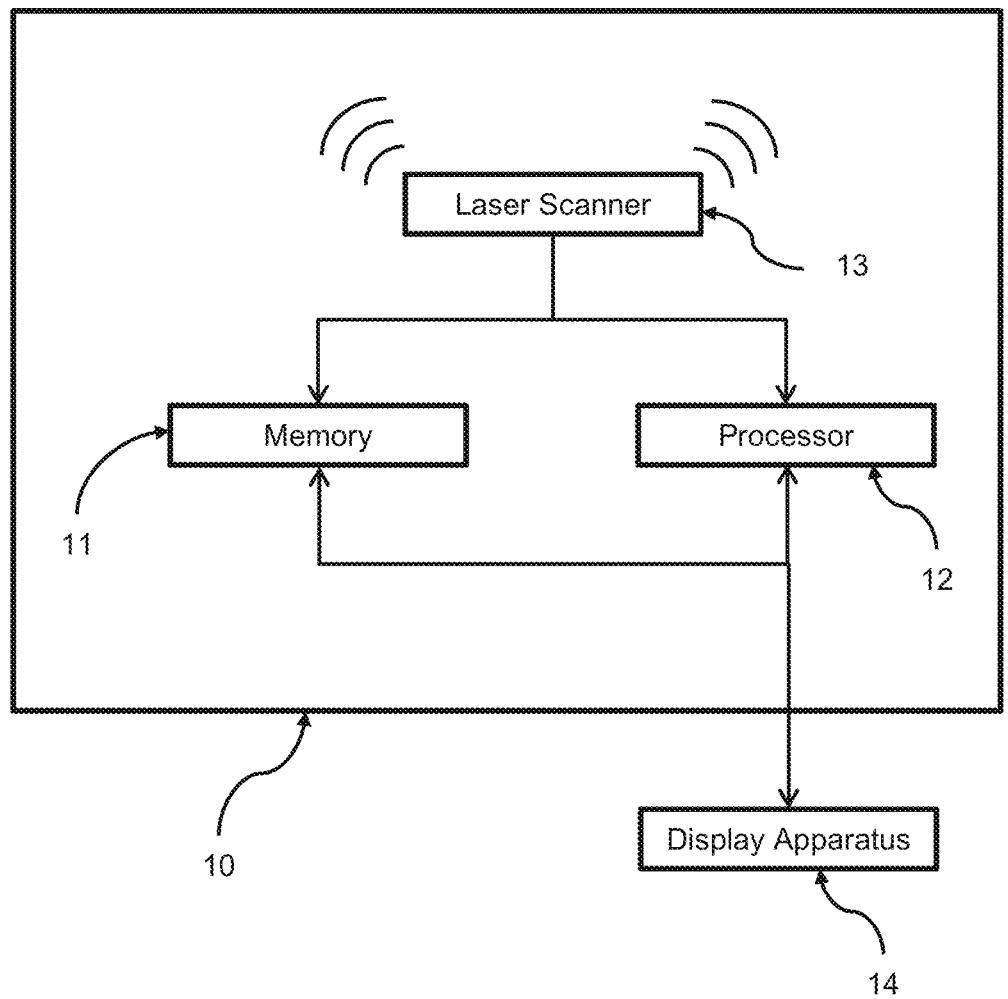
FIG. 2 is an integrated system for constructing a 3D indoor model in accordance with certain embodiments of the present disclosure.

The integrated system 10 for constructing a 3D indoor model according to the present disclosure is depicted in FIG. 2. Based on the technical solution provided above, the present invention can utilize the point cloud data provided by the laser scanner 13 and perform high-precision 3D modeling for complex indoor scenes. The system has the advantages of high efficiency in generating the 3D model without prior knowledge. This is particularly suitable for high-precision 3D modeling of indoor scenes with high complexity. The integrated system 10 was validated using both synthetic laser scanner dataset and raw dataset from the backpack laser scanner. In one embodiment, other portable devices, such as a drone or a remote controlled robotic, having laser scanner 13 attached thereto can be used to collect the raw dataset for performing 3D indoor modeling. The backpack laser scanner comprises one or more laser scanners 13, memory 11, one or more processors 12, and may further comprises a MEMS accelerometer, and a GPS positioning device.

The laser scanner 13, controlled by a processor 12 or computer systems, continuously projects laser pulses and collects raw dataset with respect to an indoor scene with a plurality of points in Euclidean space. The acquired points collectively form a raw dataset and may be stored in the memory 11 of the backpack laser scanner, or simultaneously transmitted to the computer systems for processing. The memory 11 is a computer readable storage medium that stores a computer program for executing the 3D indoor modeling method when calling the computer program in the memory 11. The memory 11 may be a USB drive, mobile hard disk, read-only memory (ROM), random access memory (RAM), magnetic disk, optical disk or any other medium which can store program codes.

By processing the circuitry of the processor 12 or the computer systems, the raw point cloud data from the laser scanner 13 is reconstructed to a 3D indoor model of the indoor scene. The resulting 3D model is displayed on a display apparatus 14 or stored in the memory 11 for further analysis. In addition, the device can also include all necessary network interfaces, power supplies and other electronic components.

Because the situation is complicated, it is impossible to enumerate all embodiments one by one, and those skilled in the art should be aware that there are many embodiments according to the basic method and principle provided by this application and the actual situation, which should fall within the scope of protection of this application if there is no sufficient creative work.

Figure 3:
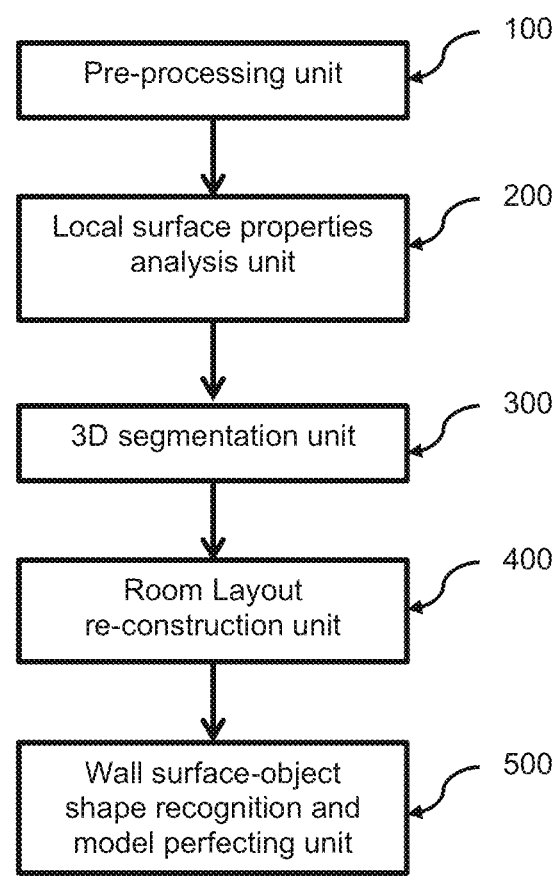
FIG. 3 is a structural block diagram of a 3D indoor modeling system based on point cloud data in accordance with certain embodiments of the present disclosure.

Now referring to FIG. 3, the structural block diagram of a 3D indoor modeling system based on point cloud data according to certain embodiment of the present disclosure is provided. The system comprises: a pre-processing unit 100, a local surface properties analysis unit 200, a 3D point segmentation unit 300, a room layout re-construction unit 400, and a wall surface shape recognition and model perfecting unit 500.

The pre-processing unit 100 is used to pre-process the collected raw point cloud data to obtain the processed point cloud data.

The local surface properties analysis unit 200 is used to perform local surface properties analysis for the processed point cloud data to obtain the normal vectors and curvature values.

The 3D point segmentation unit 300 is used to perform hybrid segmentation operation for the processed point cloud data according to the normal vectors and the curvature values, so as to obtain each of the initial planes.

The room layout re-construction unit 400 is used to perform room layout re-construction for each of the initial planes to obtain the initial 3D model.

The wall surface shape recognition and model perfecting unit 500 is used to identify the specific form of the wall surface according to the returned laser pulse and the distance between the wall surface-objects and the wall surface, and perfect the initial 3D model according to the specific form.

In particular, the pre-processing unit 100 may comprise a down-sampling sub-unit and a statistical outlier removal sub-unit. The down-sampling sub-unit is used to perform down-sampling for the raw point cloud data to obtain down-sampled point cloud data. The statistical outlier removal sub-unit is used to remove the outliers in the down-sampled point cloud data to obtain the processed point cloud data.

Further, the down-sampling sub-unit may comprise a voxelization processing module, which is used to perform voxelization processing for the raw point cloud data to obtain the down-sampled point cloud data.

Further, the statistical outlier removal sub-unit may comprise a location and scale parameter removal module, which is used to remove the outliers according to the location median value and the scale mean absolute deviation of each point in the down-sampled point cloud data, so as to obtain the processed point cloud data.

The 3D point segmentation unit 300 may comprise a region segmentation sub-unit and an algorithm segmentation sub-unit. The region segmentation sub-unit is used to segment the processed point cloud data into a plurality of clusters by using the region growing algorithm based on the normal vector and curvature value. The algorithm segmentation sub-unit is used to process each of the clusters by using the RANSAC algorithm, so as to obtain each of the initial planes.

The room layout re-construction unit 400 may comprise a plane processing and room distribution sub-unit and an initial 3D modeling sub-unit.

The plane processing and room distribution sub-unit is used to perform re-orientation and structural element detection operation for each of the initial planes to obtain the ceilings, walls and floors, and each of the ceilings, each of the walls and each of the floors are distributed to each room according to the room boundary information. The initial 3D modeling sub-unit is used to build the 3D model of each of the rooms according to the height information and the void area, so as to obtain the initial 3D model.

In certain embodiments, the 3D indoor modeling system may comprise a void type identification unit, which uses the preset number of void type description parameters to identify the corresponding void type when it is recognized that there is a void in the wall.

What is claimed is:

1. A method for building a 3D indoor model based on raw point cloud data by a processor without any prior knowledge of an indoor scene, the raw point cloud data being acquired by a laser scanner with respect to the indoor scene, the method comprising:
    removing noise and outliers from the raw point cloud data to obtain processed point cloud data;
    performing local surface properties analysis on the processed point cloud data to obtain normal vectors and curvature values;
    performing 3D point segmentation on the processed point cloud data based on the normal vectors and curvature values to obtain a plurality of initial planes having a plurality of points in a 3D space;
    constructing an initial 3D model of rooms based on the plurality of initial planes, comprising:
        performing re-orientation and structural element detection operation for each of the initial planes to obtain one or more planes of ceiling, walls and floor;
        clustering to each of the rooms based on room boundary information; and
        performing room layout re-construction to re-construct the initial 3D model, comprising:

performing boundaries re-construction using a modified convex hull algorithm in the 2D space and a line growing algorithm;

performing in-hole re-construction to determine inner boundaries by detecting voids in the one or more planes of ceiling; and refining boundary line segments by discarding the plurality of points near a boundary of the plane having a high surface variation;

and performing wall surface-object re-construction to obtain the 3D indoor model with additional details related to wall surface-objects.

2. The method of claim 1, wherein the removing noise and outliers from the raw point cloud data comprises:

performing down-sampling on the raw point cloud data to obtain down-sampled point cloud data; and removing outliers from the down-sampled point cloud data to obtain the processed point cloud data.

3. The method of claim 2, wherein down-sampling on the raw point cloud data is performed using voxelization.

4. The method of claim 2, wherein the outliers are removed according to a median value of locations and the mean absolute deviation (MAD) of a scale parameter of the points in the 3D space.

5. The method of claim 1, wherein the local surface properties analysis on the processed point cloud data is performed by calculating eigenvalues based on a covariance matrix in a 3D space.

6. The method of claim 1, wherein performing the 3D point segmentation on the processed point cloud data comprises:

segmenting the processed point cloud data into a plurality of clusters using a region growing algorithm based on the normal vectors and the curvature values; and processing each of the plurality of clusters using a Random Sample Consensus (RANSAC) algorithm to obtain the plurality of initial planes.

7. The method of claim 1, wherein the performing of wall surface-object re-construction to obtain the 3D indoor model with additional details related to wall surface-objects comprises:

projecting and rasterizing the point cloud data within a threshold distance of less than a wall thickness;

clustering and recognizing a detected empty space; and modifying the clusters by identifying a void area as a wall surface.

8. The method of claim 7, wherein the detected empty space is determined to be the void area or a blocked area by applying region growth algorithm and performing statistical analysis.

9. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 1.

10. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 2.

11. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 3.

12. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 4.

13. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 5.

14. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 6.

15. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 7.

16. An integrated system comprising:

a laser scanner for acquiring raw point cloud data of an indoor scene; and a processor coupled to the laser scanner, the processor being configured to execute a process for building a 3D indoor model based on the raw point cloud data from the laser scanner according to the method of claim 8.

17. A method for building a 3D indoor model based on raw point cloud data by a processor without any prior knowledge of an indoor scene, the raw point cloud data being acquired by a laser scanner with respect to the indoor scene, the method comprising:

removing noise and outliers from the raw point cloud data to obtain processed point cloud data;

performing local surface properties analysis on the processed point cloud data to obtain normal vectors and curvature values;

performing 3D point segmentation on the processed point cloud data based on the normal vectors and curvature values to obtain a plurality of initial planes having a plurality of points in a 3D space;

constructing an initial 3D model of rooms based on the plurality of initial planes; and performing wall surface-object re-construction to obtain the 3D indoor model with additional details related to wall surface-objects, comprising:

projecting and rasterizing the point cloud data within a threshold distance of less than a wall thickness;

clustering and recognizing a detected empty space; and modifying the clusters by identifying a void area as a wall surface.

18. The method of claim 17, wherein the detected empty space is determined to be the void area or a blocked area by applying region growth algorithm and performing statistical analysis.

19. The method of claim 17, wherein the removing noise and outliers from the raw point cloud data comprises:
performing down-sampling on the raw point cloud data to obtain down-sampled point cloud data; and
removing outliers from the down-sampled point cloud data to obtain the processed point cloud data.

20. The method of claim 19, wherein down-sampling on the raw point cloud data is performed using voxelization.

21. The method of claim 19, wherein the outliers are removed according to a median value of locations and the mean absolute deviation (MAD) of a scale parameter of the points in the 3D space.

22. The method of claim 17, wherein the local surface properties analysis on the processed point cloud data is performed by calculating eigenvalues based on a covariance matrix in a 3D space.

23. The method of claim 17, wherein performing the 3D point segmentation on the processed point cloud data comprises:
segmenting the processed point cloud data into a plurality of clusters using a region growing algorithm based on the normal vectors and the curvature values; and
processing each of the plurality of clusters using a Random Sample Consensus (RANSAC) algorithm to obtain the plurality of initial planes.

24. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 17.

25. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 18.

26. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 19.

27. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 20.

28. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 21.

29. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 22.

30. An integrated system comprising:
a laser scanner for acquiring raw point cloud data of an indoor scene; and
a processor coupled to the laser scanner, the processor being configured to execute a process for building a 3D indoor model based on the raw point cloud data from the laser scanner according to the method of claim 23.

* * * * *